United States Patent
Hattori et al.

(10) Patent No.: US 9,245,969 B2
(45) Date of Patent: Jan. 26, 2016

(54) NONVOLATILE SEMICONDUCTOR MEMORY DEVICE

(71) Applicant: KABUSHIKI KAISHA TOSHIBA, Minato-ku (JP)

(72) Inventors: Shigeki Hattori, Kanagawa (JP); Masaya Terai, Kanagawa (JP); Hideyuki Nishizawa, Tokyo (JP); Koji Asakawa, Kanagawa (JP); Yoshiaki Fukuzumi, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/821,368

(22) Filed: Aug. 7, 2015

(65) Prior Publication Data

US 2015/0349081 A1 Dec. 3, 2015

Related U.S. Application Data

(62) Division of application No. 13/934,784, filed on Jul. 3, 2013, now Pat. No. 9,142,562.

(60) Provisional application No. 61/767,433, filed on Feb. 23, 2013.

(51) Int. Cl.
*H01L 27/115* (2006.01)
*H01L 29/51* (2006.01)
*H01L 29/788* (2006.01)

(52) U.S. Cl.
CPC .......... *H01L 29/511* (2013.01); *H01L 29/7883* (2013.01)

(58) Field of Classification Search
CPC ............... H01L 29/7883; H01L 29/42324; H01L 27/115; H01L 27/11521; H01L 21/28273
USPC ........................................ 257/321
See application file for complete search history.

(56) References Cited

U.S. PATENT DOCUMENTS

| 6,716,378 B2 | 4/2004 | Yang et al. |
| 2006/0093746 A1 | 5/2006 | Strang |

(Continued)

FOREIGN PATENT DOCUMENTS

| EP | 0 481 362 A2 | 4/1992 |
| JP | 4-273477 | 9/1992 |

(Continued)

OTHER PUBLICATIONS

Jinping Dong, et al., "Nanoscale Aggregate Structures of Trisiloxane Surfactants at the Solid-Liquid Interface", Langmuir, vol. 20, No. 7, 2004, pp. 2695-2700.

(Continued)

*Primary Examiner* — Monica D Harrison
(74) *Attorney, Agent, or Firm* — Oblon, McClelland, Maier & Neustadt, L.L.P.

(57) ABSTRACT

A nonvolatile semiconductor memory device according to an embodiment includes: a semiconductor layer; a block insulating film; an organic molecular layer, which is formed between the semiconductor layer and the block insulating film, and provided with a first organic molecular film on the semiconductor layer side containing first organic molecules and a second organic molecular film on the block insulating film side containing second organic molecules, and in which the first organic molecule has a charge storing unit and the second organic molecule is an amphiphilic organic molecule; and a control gate electrode formed on the block insulating film.

11 Claims, 16 Drawing Sheets

(56) References Cited

U.S. PATENT DOCUMENTS

| | | | |
|---|---|---|---|
| 2007/0087489 A1 | 4/2007 | Park et al. |
| 2011/0186829 A1 | 8/2011 | Burroughes et al. |
| 2011/0203523 A1 | 8/2011 | Strang |
| 2012/0112171 A1 | 5/2012 | Hattori et al. |
| 2012/0241713 A1 | 9/2012 | Nishizawa et al. |
| 2013/0242670 A1 | 9/2013 | Hattori et al. |
| 2013/0248962 A1 | 9/2013 | Morota et al. |
| 2014/0034899 A1 | 2/2014 | Ahn et al. |

FOREIGN PATENT DOCUMENTS

| | | |
|---|---|---|
| JP | 2006-150350 | 6/2006 |
| JP | 2007-116170 | 5/2007 |
| JP | 2011-86765 | 4/2011 |
| JP | 2012-509573 | 4/2012 |
| JP | 2012-104675 | 5/2012 |
| JP | 2012-204433 | 10/2012 |
| JP | 2012-204434 | 10/2012 |
| JP | 2013-197269 A | 9/2013 |
| JP | 2013-197363 A | 9/2013 |
| WO | WO 2012/127863 A1 | 9/2012 |

OTHER PUBLICATIONS

Meng Li, et al., "Atomic Layer Deposition of Aluminum Oxide on Carboxylic Acid-Terminated Self-Assembled Monolayers", Langmuir, vol. 25, 2009, pp. 1911-1914.

FIG.4A

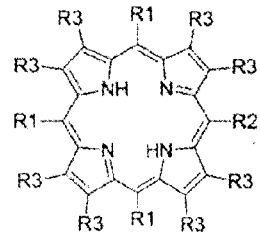

R1, R2, and R3 can be selected independently of one another.
R1, R2, and R3 might be the same.
At least one of R1 through R3 is bound to connecting unit 26c.

FIG.4B

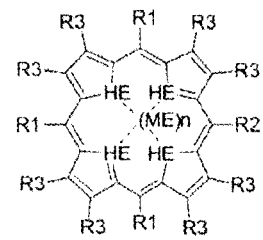

R1, R2, and R3 can be selected independently of one another.
R1, R2, and R3 might be the same.
At least one of R1 through R3 is bound to connecting unit 26c.
HE: Hetero atom
ME: Metal atom (Zn, Ti, Cu, Ir, Ru, Ni, Co, Li, Mn, Mg)
n=0, 1

FIG.4C

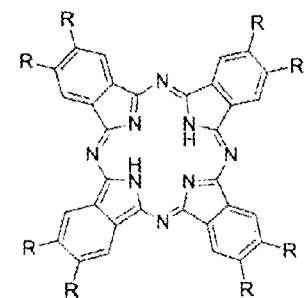

FIG.4D

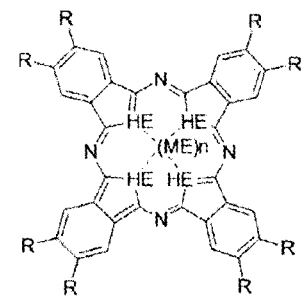

HE: Hetero atom
ME: Metal atom (Zn, Ti, Cu, Ir, Ru, Ni, Co, Li, Mn, Mg)
n=0, 1
At least one of R is bound to connecting unit 26c.

FIG.15
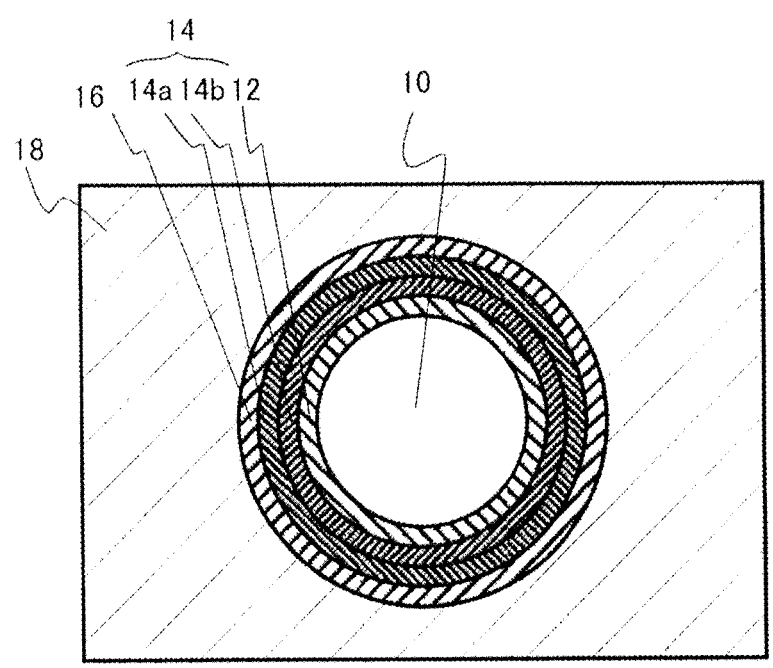
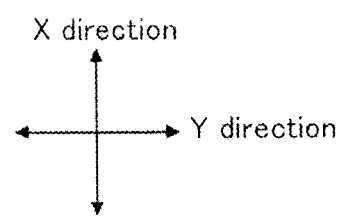

FIG.17
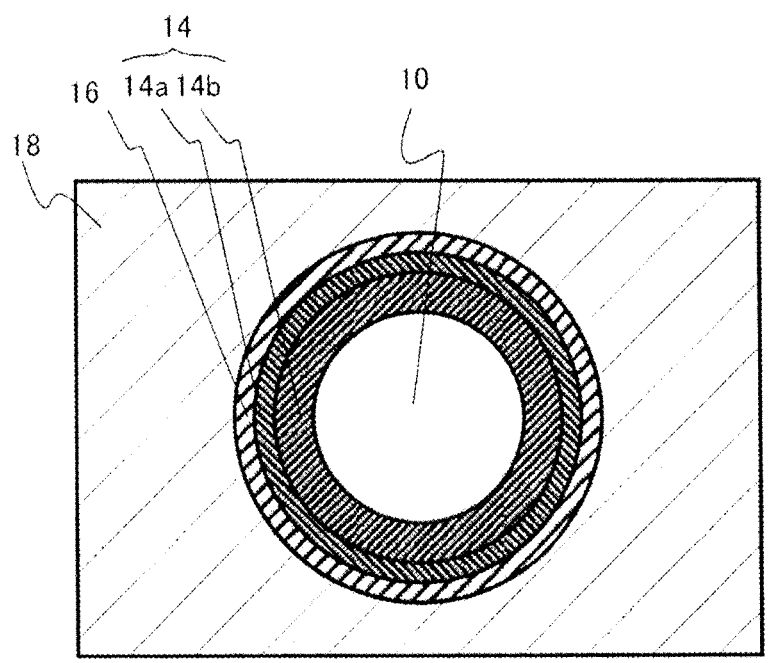
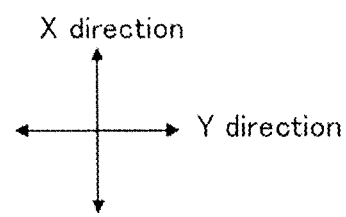

NONVOLATILE SEMICONDUCTOR MEMORY DEVICE

CROSS-REFERENCE TO RELATED APPLICATION

This divisional application is based upon and claims the benefit of priority under 35 U.S.C. §120 from U.S. application Ser. No. 13/934,784, filed Jul. 3, 2013, which claims the benefit of priority from U.S. Provisional Application No. 61/767,433, filed on Feb. 21, 2013, the entire contents of each of which are incorporated herein by reference.

FIELD

Embodiments described herein generally relate to a nonvolatile semiconductor memory device.

BACKGROUND

As a method for realizing reduced bit cost of a nonvolatile semiconductor memory device and also enhancing memory performance thereof, scaling down of a memory cell is promising. However, scaling down of the memory cell has become technically difficult.

It has thus been proposed to use organic molecules for a charge storing layer. Because, various organic molecules can be formed by organically synthesize a variety of molecular structures and substituent groups, desired electrochemical properties can be applied to the organic molecules. And constitutional unit of the organic molecules is small. Therefore, the organic molecules may realize further scaling-down of the memory cell. In realizing the scaling-down of the memory cell, it is of importance to improve qualities of a block insulating film and a control gate electrode, formed on the charge storing layer.

BRIEF DESCRIPTION OF THE DRAWINGS

FIGS. 4A to 4D are diagrams each exemplifying a molecular structure of a charge storing unit according to the first embodiment;

FIG. 15 is an X-Y sectional view of the nonvolatile semiconductor memory device of FIG. 14 according to the sixth embodiment;

FIG. 17 is an X-Y sectional view of the nonvolatile semiconductor memory device of FIG. 14 according to the seventh embodiment;

DETAILED DESCRIPTION

A nonvolatile semiconductor memory device according to an embodiment includes: a semiconductor layer; a block insulating film; an organic molecular layer which is formed between the semiconductor layer and the block insulating film and provided with a first organic molecular film containing first organic molecules on the semiconductor layer side and a second organic molecular film containing second organic molecules on the block insulating film side, and in which the first organic molecule has a charge storing unit and the second organic molecule is an amphiphilic organic molecule; and a control gate electrode formed on the block insulating film.

Hereinafter, embodiments will be described with reference to the drawings.

First Embodiment

A nonvolatile semiconductor memory device according to the present embodiment includes a semiconductor layer, a block insulating film, and an organic molecular layer formed between the semiconductor layer and the block insulating film. The organic molecular layer is provided with a first organic molecular film containing first organic molecules on the semiconductor layer side, and a second organic molecular film containing second organic molecules on the block insulating film side. The first organic molecule has a charge storing unit, and the second organic molecule is an amphiphilic organic molecule. The memory device further includes a tunnel insulating film formed between the semiconductor layer and the organic molecular layer.

In the nonvolatile semiconductor memory device according to the present embodiment, a high-quality block insulating film can be realized by provision of the above configuration. This leads to improved insulation properties between the charge storing unit and the control gate electrode, thereby to improving data retention properties. This also leads to an improved reliability of the block insulating film.

Figure 1:
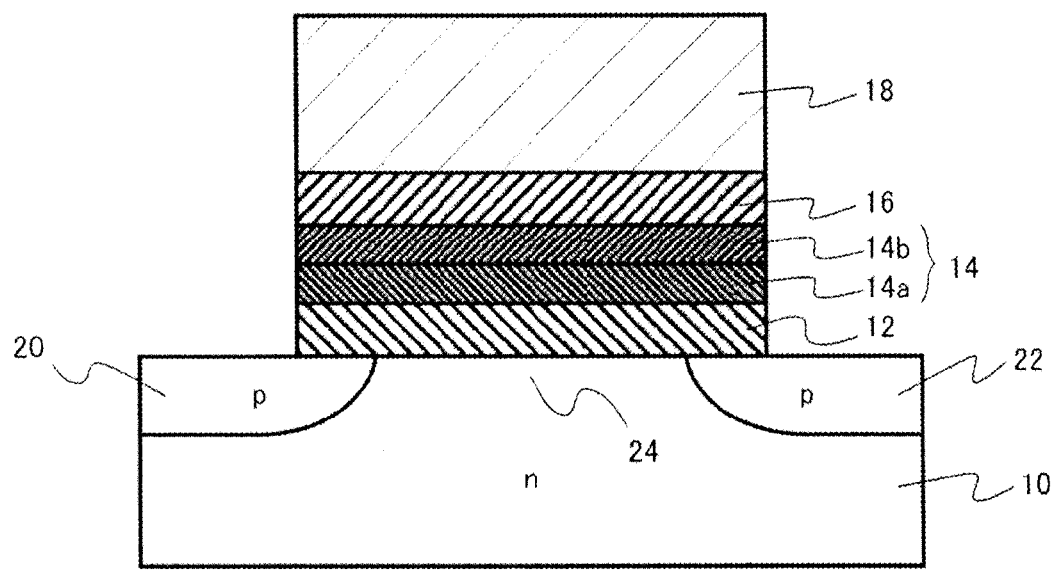
FIG. 1 is a sectional view of a memory cell unit of a nonvolatile semiconductor memory device according to a first embodiment.
Figure 2:
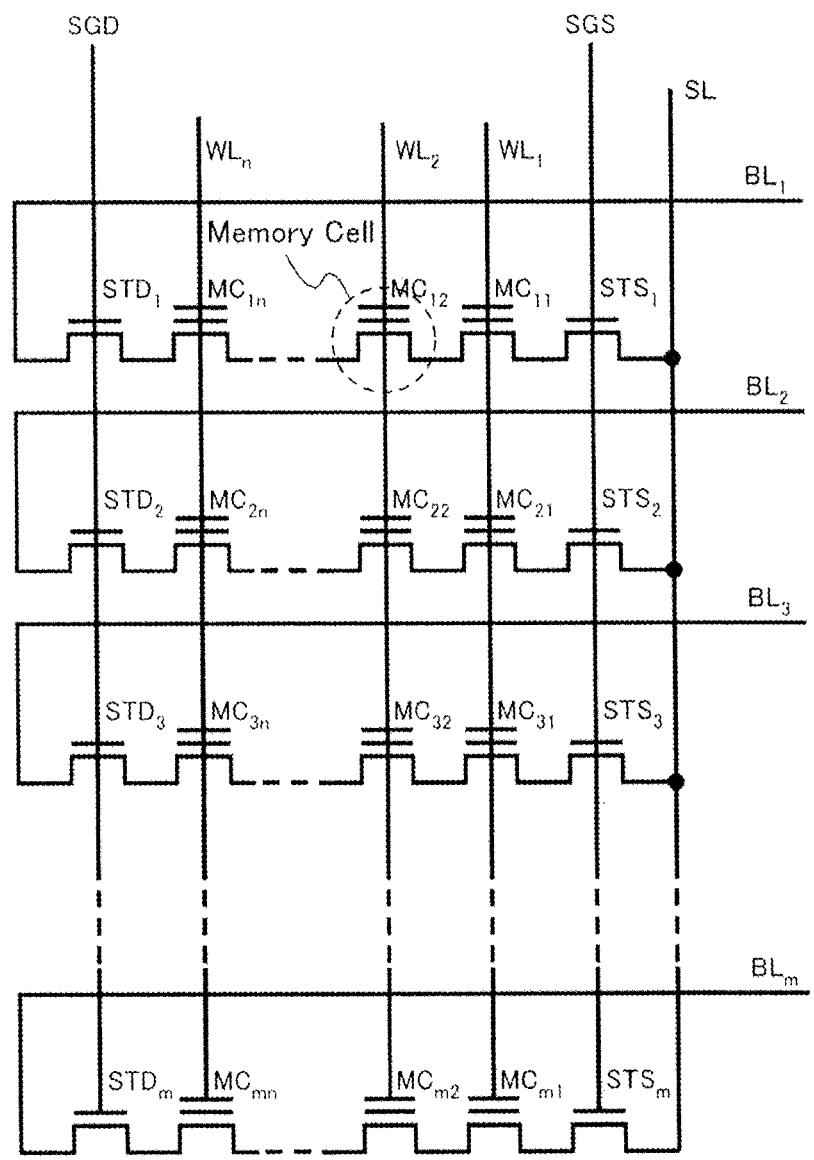
FIG. 2 is a circuit diagram of a memory cell array of the nonvolatile semiconductor memory device according to the first embodiment.

FIG. 1 is a sectional view of a memory cell unit of the nonvolatile semiconductor memory device according to the present embodiment. FIG. 2 is a circuit diagram of a memory cell array of the nonvolatile semiconductor memory device according to the first embodiment. The nonvolatile semiconductor memory device of the present embodiment is an NAND nonvolatile semiconductor memory device.

As shown in FIG. 2, for example, the memory cell array is made up of memory cell transistors $MC_{11}$ to $MC_{1n}$, $MC_{21}$ to $MC_{2n}$, ..., and $MC_{m1}$ to $MC_{mn}$, as m×n (m and n are integers) transistors having a floating-gate structure. In the memory cell array, these memory cell transistors are arrayed in a column direction and in a row direction; and a plurality of memory cell transistors are thereby arranged in a matrix form.

In the memory cell array, for example, the memory cell transistors $MC_{11}$ to $MC_{1n}$ and select gate transistors $STS_1$ and $STD_1$ are series-connected, to form an NAND string (memory string) as a cell unit.

A drain region of the select gate transistor $STS_1$ for selecting the memory cell transistors $MC_{11}$ to $MC_{1n}$ is connected to a source region of the memory cell transistor $MC_{11}$ located at the end of the array of the series-connected group of the memory cell transistors $MC_{11}$ to $MC_{1n}$. Further, a source region of the select gate transistor $STD_1$ for selecting the memory cell transistors $MC_{11}$ to $MC_{1n}$ is connected to a drain region of the memory cell transistor $MC_{1n}$ located at the end of the array of the series-connected group of the memory cell transistors $MC_{11}$ to $MC_{1n}$.

Select gate transistors $STS_2$ to $STS_m$, memory cell transistors $MC_{21}$ to $MC_{2n}$, ..., and $MC_{m1}$ to $MC_{mn}$, and select gate transistors $STD_2$ to $STD_m$ are also series-connected respectively, to constitute NAND strings.

A common source line SL is connected to the sources of the select gate transistors $STS_1$ to $STS_m$.

The memory cell transistors $MC_{11}$, $MC_{21}$, ..., and $MC_{m1}$, the memory cell transistors $MC_{12}$, $MC_{22}$, ..., and $MC_{m2}$, ... and the memory cell transistors $MC_{1n}$, $MC_{2n}$, ..., and $MC_{mn}$ are each connected by word lines $WL_1$ to $WL_n$ which control operating voltages to be applied to the control gate electrodes.

Further provided are a common select gate line SGS for the select gate transistors $STS_1$ to $STS_m$ and a common select gate line SGD for the select gate transistors $STD_1$ to $STD_m$.

It is to be noted that peripheral circuits, not shown, are formed on the periphery of the memory cell array of FIG. 2.

FIG. 1 shows a cross section of a memory cell in the memory cell array shown in FIG. 2, e.g., the memory cell surrounded by a dashed line in FIG. 2. In the present embodiment, a case where a transistor of the memory cell is a p-type transistor having holes as carriers will be described as an example.

The memory cell is formed, for example, on an n-type silicon semiconductor layer 10 containing n-type impurities. A tunnel insulating film 12 is provided on the silicon semiconductor layer 10, an organic molecular layer 14 is provided on the tunnel insulating film 12, a block insulating film 16 is provided on the organic molecular layer 14, and a control gate electrode 18 is provided on the block insulating film 16. On both sides of the control gate electrode 18, a source region 20 and a drain region 22 are formed in the semiconductor layer 10. A region below the gate electrode 18 in the semiconductor layer 10 is a channel region 24. The channel region 24 is interposed between the source region 20 and the drain region 22.

Herein, the organic molecular layer 14 functions as a charge storing layer. That is, it has a function to actively store charges as memory cell information. At the time of performing writing/erasing on the memory cell, the tunnel insulating film 12 functions as an electron/hole transfer pathway between the channel region 24 in the semiconductor layer 10 and the organic molecular layer 14 through a tunneling phenomenon. Further, at the time of reading/standby, the tunnel insulating film 12 has a function to suppress electron/hole transfer between the channel region 24 and the organic molecular layer 14 due to its barrier height. Moreover, the block insulating film 16 is a so-called interelectrode insulating film, and has a function to block the electron/hole flow between the organic molecular layer 14 and the control gate electrode 18.

In the nonvolatile semiconductor memory device according to the present embodiment, data is written when a positive voltage or a negative voltage is applied to the control gate electrode 18, and data is erased when a reverse voltage to that at the time of writing is applied. When the positive voltage or the negative voltage is applied to the control gate electrode 18, charges transfer in the tunnel insulating film 12 and are stored into the organic molecular layer 14, and data is thus written. When the reverse voltage to that at the time of writing is applied to the control gate electrode 18, stored charges pass through the tunnel insulating film 12, and data is thus erased.

Other than silicon, silicon germanide, germanium, a compound semiconductor, and the like can be used for the semiconductor layer 10.

The tunnel insulating film 12 is, for example, an oxide film, a nitride film, or an oxynitride film. For example, it is a silicon oxide ($SiO_2$) film. The tunnel insulating film 12 may be either a single-layer film or a multilayer film. The material for the tunnel insulating film 12 is not restricted to silicon oxide exemplified above, but another type of an insulating film can be applied if appropriate.

The tunnel insulating film 12 desirably has a dielectric constant not larger than 4. With the dielectric constant being not larger than 4, a later-described retention time for charges stored in the organic molecular layer 14 is held long.

Further, a film thickness of the tunnel insulating film 12 is for example from 1 to 10 nm, and desirably from 5 to 10 nm. When the film thickness of the tunnel insulating film 12 is smaller than 1 nm, a charge direct tunnel phenomenon occurs between the semiconductor layer 10 and the organic molecular layer 14, to shorten the retention time for charges stored in the organic molecular layer 14.

From the viewpoint of obtaining a sufficient charge retention time, the film thickness is preferably not smaller than 5 nm. Further, when the film thickness of the tunnel insulating film 12 is larger than 10 nm, the film thickness of the entire memory cell becomes large. It is to be noted that the foregoing thicknesses are all physical film thicknesses.

When the tunnel insulating film 12 is silicon oxide, it can be formed by introducing a silicon substrate into a thermal oxidization furnace for forcible oxidation.

The organic molecular layer 14 is made up of organic molecules and has a thickness of about 1 to 20 nm, for example. The organic molecular layer 14 is provided with a first organic molecular film 14a and a second organic molecular film 14b. The first organic molecular film 14a is formed on the tunnel insulating film 12. The second organic molecular film 14b is formed on the first organic molecular film 14a.

The first organic molecular film 14a is provided with a charge storing unit, and mainly plays, a function to store charges. The first organic molecular film 14a is a self-assembled monolayer (SAM).

Further, the second organic molecular film 14b is provided with amphiphilic organic molecules. The second organic molecular film 14b is adsorbed to the first organic molecular film 14a. The second organic molecular film 14b mainly plays a function to reform the hydrophobic surface of the first organic molecular film 14a to the hydrophilic surface.

The block insulating film 16 is formed on the second organic molecular film 14b. The block insulating film 16 is, for example, hafnium oxide ($HfO_2$). Other than hafnium oxide ($HfO_2$) described above, for example, aluminum oxide ($Al_2O_3$), silicon oxide ($SiO_2$), zirconium oxide ($ZrO_2$), titanium oxide ($TiO_2$), and the like are used for the block insulating film 16. The block insulating film 16 may be either a single-layer film or a stacked film.

Further, a film thickness of the block insulating film 16 is for example from 5 to 20 nm, and desirably from 5 to 10 nm. When the film thickness of the block insulating film 16 is smaller than 5 nm, charges stored in the organic molecular layer 14 quickly pass therethrough to the control gate electrode 18 side due to the direct tunnel phenomenon, which might shorten the charge retention time. Further, when the film thickness of the block insulating film 16 is not smaller than 10 nm, the total film thickness of the nonvolatile storage device becomes large, causing an impediment to bit cost scaling. The block insulating film is, for example, a film formed by the Atomic Layer Deposition (ALD) method.

The gate electrode 18 is, for example, polycrystalline silicon or amorphous silicon introduced with impurities and imparted with conductivity. Further, for the control gate electrode 18, metal, an alloy, a metal semiconductor compound or the like may be used.

Moreover, the source region 20 and the drain region 22 are formed, for example, of p-type diffusion layers containing p-type impurities.

Figure 3:
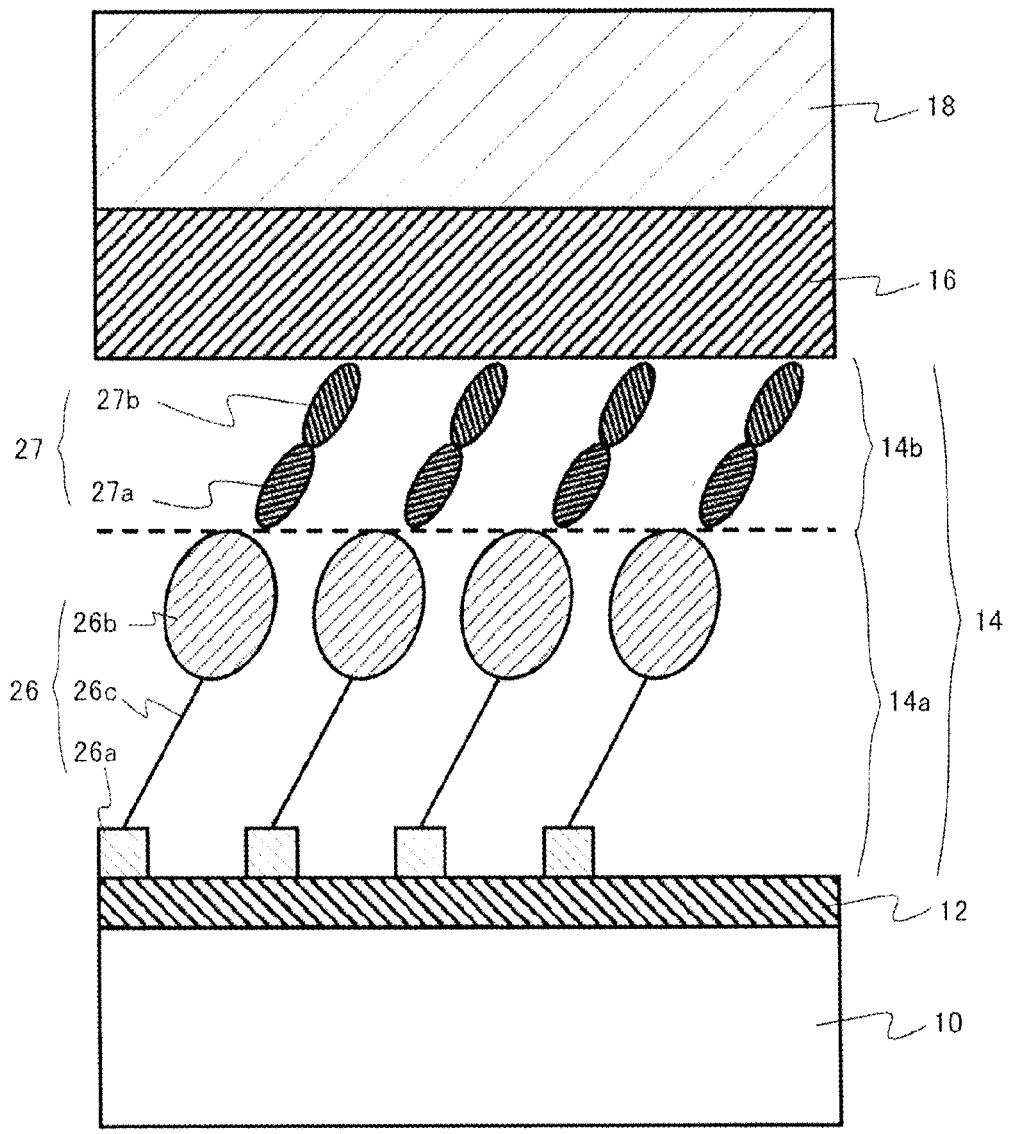
FIG. 3 is an enlarged sectional view of the memory cell unit of the nonvolatile semiconductor memory device according to the first embodiment.

FIG. 3 is an enlarged sectional view of the memory cell unit of the nonvolatile semiconductor memory device according to the present embodiment. It is a view showing a detail of the organic molecular layer 14.

The organic molecular layer 14 has a stacked or laminated structure of the first organic molecular film 14a and the second organic molecular film 14b. The first organic molecular film 14a contains a plurality of first organic molecules 26, and the second organic molecular film 14b contains a plurality of second organic molecules 27.

As described above, the first organic molecular film 14a is a self-assembled monolayer (SAM).

The first organic molecule 26 has a function to store charges that are to be data of the memory cell. As shown in FIG. 3, the first organic molecule 26 is made up of a terminal group (modified group) 26a that is chemically bonded to the tunnel insulating film 12, a charge storing unit 26b that stores charges, and a connecting unit 26c that connects between the terminal group 26a and the charge storing unit 26b.

The terminal group 26a has a function to bond the first organic molecules 26 onto the tunnel insulating film 12 through a chemical bond (covalent bond, ionic bond, or metallic bond). Thereby, the first organic molecules 26 are arranged on the tunnel insulating film 12 without being a multilayer. For this reason, the first organic molecules 26 compose a monomolecular film, and it is thus possible to ensure the uniformity of the film thickness and achieve scaling-down of the device by decreasing the film thickness.

For the terminal group 26a, it is desirable to use a chemical reaction group which is generally used for the self-assembled monolayer (SAM). For example, one for the terminal group 26a is desirably selected from a silyl group, an alkoxysilyl group, an alkylsilyl group, a chlorosilyl group, a phosphoryl group, an alkyl selenide group, a telluride group, a sulfide group, a disulfide group, a thio group, an isocyanate group, an alkyl bromide group, a carbonyl group, an alkoxy group, alkane and alkene.

Further, when a metal oxide is used for the tunnel insulating film 12, the terminal group 26a is desirably a group showing a chemical reactivity to the metal oxide. Examples of the group showing a chemical reactivity to the metal oxide include a hydroxy group, a methoxysilyl group, a trimethoxysilyl group, a dimethyl-methoxysilyl group, a diethyl-methoxysilyl group, an ethoxysilyl group, a triethoxysilyl group, a dimethyl-ethoxysilyl group, a diethyl-ethoxysilyl group, a thiol group, a carboxyl group, a sulfone group, and a phosphonate group. From the viewpoints of ease of organic synthesis and the chemical reactivity with metal oxide, it is preferable to use the methoxysilyl group, the trimethoxysilyl group, the ethoxysilyl group, the dimethyl-ethoxysilyl group, the triethoxysilyl group, and the phosphonate group. Further, when the metal oxide is aluminum oxide ($Al_2O_3$), the phosphonate group is preferably used.

The charge storing unit 26b has a function to store charges by application of an electric field. The charge storing unit 26b preferably has a multicyclic structure. It is, for example, possible to apply macrocyclic molecules represented by porphyrin and phthalocyanine, and non-macrocyclic molecules such as metallocene, pentacene, anthracene, oligophenylenevinylene, thiophene, tetrathiafulvalene, tetracyanoquinodimethane, tetramethyltetraselenafulvalene, and fullerene. These molecules are not restrictive, but derivatives of those are also applicable.

The charge storing unit 26b is preferably a porphyrin derivative, a phthalocyanine derivative, a chlorine derivative, a tetrapyrrole derivative, a bipyridine derivative, an indole derivative, an acene derivative, a quinoxaline derivative, a phenylenevinylene derivative, or a fullerene derivative.

The charge storing unit 26b is desirably organic molecules having a multicyclic structure with a molecular weight of not smaller than 100 and not larger than 2000. When the molecular weight falls below 100, the development of a sufficient n-conjugated system cannot be obtained, thus making it difficult to achieve a stable charge exchange (oxidation-reduction reaction). When the molecular weight exceeds 2000, the thickness as the charge storing layer increases, thus making it difficult to meet the requirement for scaling-down.

FIGS. 4A to 4D are diagrams each exemplifying a molecular structure of a charge storing unit according to the first embodiment. These are examples of porphyrin, the porphyrin derivative, phthalocyanine, and the phthalocyanine derivative which are preferable for the charge storing unit 26b.

Examples of R1 to R3 and R of FIGS. 4A to 4D include hydrogen, an alkyl group, a fluoroalkyl group, an alkoxy group, an aryl group, a halogen group, a hydroxy group, an amino group, a nitro group, a phenyl group, a cycloalkyl group, a carboxy group, an amide group, an imide group, a cyano group, a thiol group, and a fluorophenyl group, provided that at least one is bonded to the connecting unit 26c. In this case, a structure such as an ether bond (—O—) or an amino bond (—NH—), in addition to a C—C bond, may be introduced between the charge storing unit 26b and the connecting unit 26c.

When a central metal (ME) is contained as in FIG. 4B, charge exchange with an electron orbit of the metal may occur. A metal element in this case is selected, for example, from Zn (zinc), Ti (titanium), Cu (copper), Ir (iridium), Ru (ruthenium), Ni (nickel), Co (cobalt), Li (lithium), Mn (manganese), and Mg (magnesium). Further, when a n-conjugated system is formable, a macrocyclic molecular structure containing hetero atoms, as those shown in FIGS. 4B and 4D, is preferable.

Figure 5:
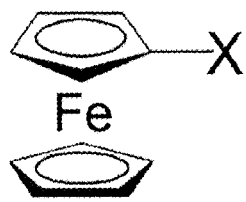
FIG. 5 is a diagram exemplifying a molecular structure of the charge storing unit according to the first embodiment.
Figure 6:
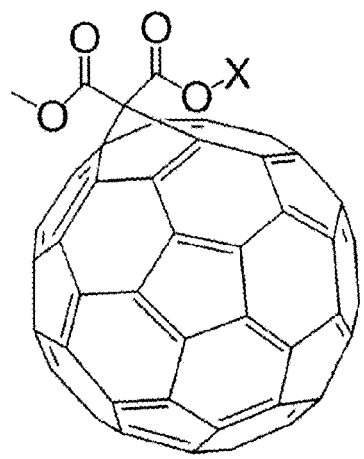
FIG. 6 is a diagram exemplifying a molecular structure of the charge storing unit according to the first embodiment.

FIGS. 5 and 6 are diagrams exemplifying molecular structures of the charge storing unit 26b. FIG. 5 shows a metallocene derivative, and FIG. 6 shows a fullerene derivative.

X in FIG. 5 is a group connecting the charge storing unit 26b and the tunnel insulating film 12, and corresponds to the terminal group 26a in FIG. 3 or corresponds to the terminal group 26a and the connecting unit 26c.

Further, X in FIG. 6 is a group connecting the charge storing unit 26b and the tunnel insulating film 12, and corresponds to the terminal group 26a in FIG. 3 or corresponds to the terminal group 26a and the connecting unit 26c.

The connecting unit 26c plays a function to connect the terminal group 26a and the charge storing unit 26b. Examples thereof include saturated alkyl chains such as an alkyl chain, a phenyl chain, a methylene chain, an ethylene chain, a trimethylene chain, a tetramethylene chain, a pentamethylene chain, a hexamethylene chain, a heptamethylene chain, an octamethylene chain, a nonamethylene chain and a decamethylene chain, as well as a phenylene chain, a biphenylene chain, and a terphenylene chain Using the length of the alkyl chain or the phenylene chain to serve as the connecting unit 26c, it is possible to control the distance between the insulating layer and the charges which are stored in the charge storing unit 26b. As the chain length is longer, the tunnel distance of the charges increases and thus the charge retention time increases. On the other hand, when the chain length is excessively long, the size of the molecule increases, thereby making a total film thickness of the capacitor large. For this reason, in the case of the saturated alkyl, the chain length is desirably about 5 to 15 carbons.

The second organic molecule 27 is the amphiphilic organic molecule. The amphiphilic organic molecule is a module having chemical structures of both hydrophobic (lipophilic) properties and hydrophilic properties. In other words, it is a molecule containing therewithin both a hydrophobic (lipophilic) group and a hydrophilic group.

The second organic molecule 27 is provided with a hydrophobic unit 27a containing a hydrophobic group (lipophilic group), and a hydrophilic unit 27b containing a hydrophilic group. The second organic molecule 27 has a function to render the surface of the organic molecular layer 14 hydrophilic.

It is to be noted that in the present specification, the "amphiphilic organic molecule" includes a structure derived from the amphiphilic organic molecule. Herein, the structure derived from the amphiphilic organic molecule means a structure where the amphiphilic organic molecules at the time of film formation are, for example, bonded to atoms constituting an upper layer film such as the block insulating film 16 and the amphiphilic organic molecule are thereby bonded to the upper layer film.

The first organic molecular film 14a as the self-assembled monolayer is likely to be the hydrophobic surface. For this reason, when the block insulating film 16 made up of metal oxide is intended to be formed on the first organic molecular film 14a by ALD (Atomic Layer Deposition), only a low-density, highly defective block insulating film 16 may be obtained. This is because, with the surface energy of the first organic molecular film 14a being low and the surface energy of the block insulating film 16 being high, there is a large difference in surface energy therebetween, making it difficult to form the block insulating film 16.

In the present embodiment, the second organic molecular film 14b containing the amphiphilic organic molecules is provided between the block insulating film 16 and the first organic molecular film 14a. The second organic molecular film 14b leads to an increase in the surface energy of the first organic molecular film 14a, namely the surface energy of the organic molecular layer 14.

The amphiphilic organic molecule 27 is required to be easily adsorbed onto the surface of the first organic molecular film 14a. Further, the amphiphilic organic molecules 27 are required to render the second organic molecular film 14b after adsorption being hydrophilic. That is, the amphiphilic organic molecules 27 are required to increase the surface energy of the second organic molecular film 14b.

The hydrophobic unit 27a of the amphiphilic organic molecule 27 renders the amphiphilic organic molecule 27 being more easily adsorbed onto the surface of the first organic molecular film 14a. Further, the hydrophilic units 27b of the amphiphilic organic molecules 27 increase the surface energy of the second organic molecular film 14b after the adsorption, that is, render the surface being hydrophilic.

Examples of the chemical structure of the hydrophobic unit 27a include molecular structures made up only of an alkyl chain, a fluoroalkyl group, a polysilane chain, a phenylene chain, or the like without any hydrophilic groups such as an ether group, a carboxy group, a hydroxy group, an amino group and a thiol group. In the molecular structure, a main chain may be branched.

From the viewpoint of productivity, desirable molecular structures of the hydrophobic unit 27a are ones showing strong hydrophobic properties such as the alkyl chain and the polysilane chain. This is because the amphiphilic organic molecule 27 shows an affinity with the first organic molecular film 14a with strong hydrophobic properties and thus tends to be physically adsorbed onto it.

Examples of the chemical structure of the hydrophilic unit 27b include alcohol, calboxylic acid, amine, ethylene and ethylene glycol containing the ether group, the hydroxy group, the amino group, the thiol group, or the like. From the viewpoint of productivity, ethylene glycol is desirable.

Considering the above chemical structure, the amphiphilic organic molecule 27 is desirably a surfactant. Although examples of the surfactants may include ionic surfactants such as monoalkyl sulfate and akyltrimethylammonium salt, the ionic surfactant tends to become impurities which change a concentration of carriers of the semiconductor substrate, and is thus not preferable. For this reason, the amphiphilic organic molecule 27 is desirably a nonionic surfactant.

Examples of the nonionic surfactants include an esterified food emulsifier, glycerin-fatty acid ester used for an emulsion stabilizer, a sorbitan fatty acid ester used for a food additive, sucrose fatty acid ester, etherified alkyl polyethylene glycol, polyoxyethylene phenyl ether, and alkylglycoside. From the viewpoint of productivity, alkyl polyethylene glycol is desirable.

The second organic molecules 27 is, for example, polyethylene glycol alkylether shown in General Formula (I) below.

[General Formula (I)]

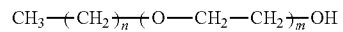

Further, the second organic molecules 27 is, for example, trisiloxanepolyethylene glycol shown in General Formula (II).

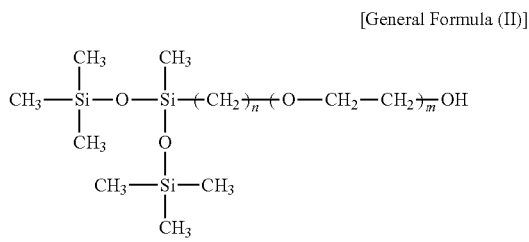

[General Formula (II)]

In the General Formulas (I) and (II), n and m are integers representing lengths of molecular chains. When the molecular chain is excessively short, the molecular weight becomes small, and thermal decomposition thus is likely to occur, which is not preferable. On the other hand, when the molecular chain is excessively long, a voluminal proportion of the molecules increases, and a film thickness thus becomes large, which is not preferable. Hence n and m in General Formula (I) and (II) are desirably integers not smaller than 3 and not larger than 20.

Figure 7:
FIG. 7 is a diagram exemplifying a molecular structure of a second organic molecule according to the first embodiment.

FIG. 7 is a diagram exemplifying a molecular structure of the second organic molecules 27. FIG. 7 shows pentaethyleneglycol monododecylether. Pentaethyleneglycol monododecylether is desirable since it can be synthesized at low cost.

Figure 8:
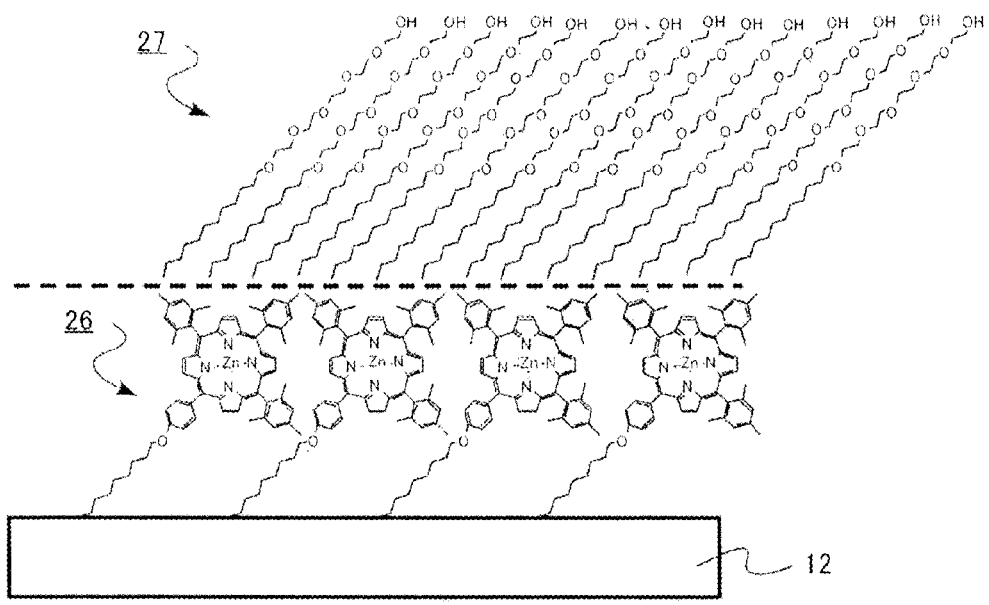
FIG. 8 is a structural diagram of an organic molecular layer according to the first embodiment.
Figure 9:
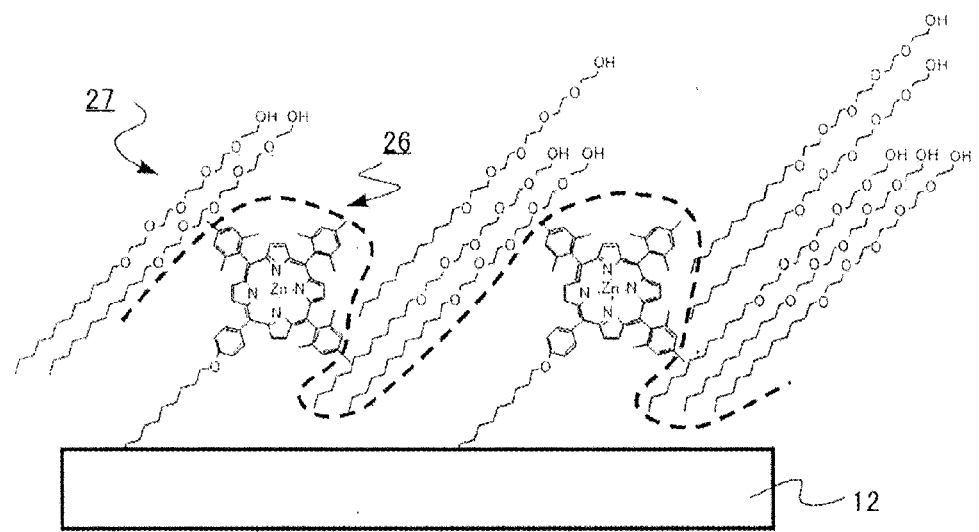
FIG. 9 is a structural diagram of the organic molecular layer according to the first embodiment.

FIGS. 8 and 9 are structural diagrams of the organic molecular layer 14. As shown in FIG. 8, a stacked structure may be formed in the organic molecular layer 14 where a boundary (dashed line in FIG. 8) between the first organic molecular film 14a and the second organic molecular film 14b is a substantially plane. Further, as shown in FIG. 9, a mixed structure may be formed where a boundary (dashed line in FIG. 9) between the first organic molecular film 14a and the second organic molecular film 14b is an irregular plane. Since the second organic molecules 27 is adsorbed to the periphery of the first organic molecules 26 by an intermolecular mutual function, when a density of the first organic molecules 26 occupying the first organic molecular film 14a is low, the second organic molecules 27 enter thereinto to form a mixed structure.

The first organic molecular film 14a made up of the first organic molecules 26 and the second organic molecular film 14b made up of the second organic molecules 27 can be detected by the following analysis methods. That is, the first organic molecule 26 and the second organic molecule 27 can be detected using a mass spectroscope (MS), a secondary ionic mass spectrometer (SIMS), a nuclear magnetic resonator (NMR), an element analyzer, an infrared reflection absorption spectroscopy (IR-RAS), an X-ray fluorescence instrument (XRF), an X-ray photoelectron instrument (XPS), an ultraviolet-visible spectrophotometer (UV-vis), a spectrophotofluorometer (FL), or the like.

When an insulating film of metal oxide or the like is formed on the first organic molecular film 14a made up of the first organic molecules 26 and the second organic molecular film 14b made up of the second organic molecules 27, for example, the analysis is performed while shaving the surface, for example, with a sputter using argon ions, or the like. Alternatively, the first organic molecular film 14a made up of the first organic molecules 26 and the second organic molecular film 14b made up of the second organic molecules 27 are dissolved and peeled by a hydrofluoric acid aqueous solution or the like, simultaneously with the insulating layer of the metal oxide or the like, and the solution is analyzed.

Further, in the method for performing the analysis by shaving the surface by means of the above sputter or the like, heating processing may be performed as the shaving method. In this case, a gas containing the shaved material may be adsorbed to another material such as an activated carbon, and another material such as the activated carbon adsorbed with the gas may be analyzed and detected. Further, in the method for peeling the material by the hydrofluoric acid aqueous solution or the like and analyzing the solution, the dissolved and peeled material may be subjected to a reduced pressure or a thermal treatment to be concentrated, and may then be analyzed and detected.

Next, a method for manufacturing the nonvolatile semiconductor memory device according to the present embodiment will be described with reference to FIGS. 1 and 3.

The method for manufacturing the nonvolatile semiconductor device according to the present embodiment includes: forming the tunnel insulating film 12 on the semiconductor layer 10; forming on the tunnel insulating film 12 the first organic molecular film 14a that contains the first organic molecules 26 having the charge storing unit 26b as a monomolecular film by self-assembling; forming on the first organic molecular film 14a the second organic molecular film 14b that contains the second organic molecules 27 as amphiphilic organic molecules; forming the block insulating film 16 on the second organic molecular film 14b; and forming the control gate electrode 18 on the block insulating film 16.

For example, the tunnel insulating film 12 is formed on the semiconductor layer (semiconductor substrate) 10 of monocrystalline silicon. When the tunnel insulating film 12 is silicon oxide, it can be formed, for example, by introducing a silicon substrate into a thermal oxidization furnace for forcible oxidation.

Further, it is also possible to form it by means of Atomic Layer Deposition (ALD) or a film forming device such as a sputter. In the case of film formation, it is desirable to anneal the insulating film after the film formation, by means of a Rapid Thermal Annealing (RTA) device.

Thus, the organic molecular layer 14 is formed on the tunnel insulating film 12. First, the first organic molecular film 14a is formed by self-assembling, and the second organic molecular film 14b is subsequently formed on the first organic molecular film 14a.

In the case of forming the first organic molecular film 14a by the self-assembling, for example, the following soaking method is applicable.

The surface of the tunnel insulating film 12 to serve as a foundation where the first organic molecules 26 are introduced is cleaned. For this cleaning, it is possible to employ, for example, cleaning by means of a mixed solution of sulfuric acid and hydrogen peroxide solution (a mixed ratio is 2:1, for example), or a UV cleaning performed by irradiating the insulating film surface with ultraviolet light.

Next, the surface of the tunnel insulating film 12 is soaked in a solution obtained by dissolving the first organic molecules 26 in a solvent, and the terminal group 26a showing chemical reactivity to the tunnel insulating film 12 is brought into reaction with the surface of the tunnel insulating film 12. It can be considered to use a solvent in which the first organic molecule 26 is easily dissolved.

As the solvent, organic solvents such as acetone, toluene, ethanol, methanol, hexane, cyclohexanone, isopropyl alcohol, benzene, chlorobenzene, toluene, xylene, tetrahydrofuran, dimethylsulfoxide, N,N-dimethylformamide, anisole, cyclohexanone, and methoxypropionic acid methyl may be included. In the case where the first organic molecules 26 can be dissolved in water, it is possible to use water as the solvent.

Regarding the concentration of the first organic molecules 26 to be dissolved in the solvent, when it is excessively low, the reaction time becomes longer, and when it is excessively high, unnecessary adsorption molecules that need to be removed by a rinsing operation increase. Hence the concentration is desirably set to be an appropriate one. For example, the concentration of the organic material is desirably set to about 1 to 100 mM.

Further, at this time, a catalyst may be added for the purpose of increasing the reactivity between the cleaned surface of the tunnel insulating film 12 and the first organic molecule 26. As the catalyst, acetic acid, formic acid, propionic acid, trifluoroacetic acid, triethylamine and ammonia which can be dissolved in the solvent are used. The amount of the catalyst added is desirably small, since the organic material is self-reacted in the solvent causing a side reaction such as polymerization when it is excessively large. It is desirably not larger than 3% with respect to a volume of the solution.

The time for soaking the surface of the tunnel insulating film 12 in the solution dissolved with the organic material is desirably the extent of the time for occurrence of a sufficient reaction, and specifically, it is desirably not shorter than one minute. The surface is then soaked in the used solvent, and rinsed using an ultrasonic cleaner. Since the unnecessarily physically adsorbed organic molecules are rinsed in this operation, it is desirable to at least replace the solvent by a new one and repeat the operation twice or more.

Subsequently, the surface is soaked in ethanol, and rinsed by use of the ultrasonic cleaner. This leads to formation of a monomolecular film made of the first organic molecules 26, namely the first organic molecular film 14a.

Next, the second organic molecular film 14b is formed on the first organic molecular film 14a. For forming the second organic molecular film 14b, for example, the following soaking method can be applied.

The semiconductor substrate 10 whose surface is the first organic molecular film 14a is dissolved in a solution obtained by dissolving the second organic molecules 27 in the solvent, and the second organic molecules 27 are adsorbed to the first organic molecular film 14a. As the solvent, it is considered to use one in which the second organic molecule 27 tends to be dissolved.

As the solvent, organic solvents such as acetone, toluene, ethanol, methanol, hexane, cyclohexanone, isopropyl alcohol, benzene, chlorobenzene, toluene, xylene, tetrahydrofuran, dimethylsulfoxide, N,N-dimethylformamide, anisole, cyclohexanone, and methoxypropionic acid methyl may be included. In the case where the second organic molecule 27 can be dissolved in water, it is possible to use water as the solvent.

Regarding the concentration of the second organic molecules to be dissolved in the solvent, when it is excessively low, the adsorption time becomes longer, and when it is excessively high, unnecessary multilayer adsorption molecules that need removing by the rinsing operation increase. Hence the concentration is desirably set to be an appropriate one. For example, the concentration of the second organic molecules is desirably set to about 1 to 100 mM.

The time for soaking the semiconductor substrate 10 in the solution dissolved with the second organic molecules 27 is desirably the extent of the time for occurrence of sufficient reaction, and specifically, it is desirably not shorter than one minute. It is then soaked to rinse in the used solvent. It is to be noted that, although an ultrasonic cleaner may be used in the rinsing operation, it is better to complete the treatment within a minute since the adsorbed second organic molecules 27 are completely desorbed if the operation is performed for a long period of time.

In addition, at the time of forming the second organic molecular film 14b, the following spin-coating method may be applied.

In this case, the semiconductor substrate 10 formed with the first organic molecular film 14a on its surface is fixed to a stage of a spin coater. The solution obtained by dissolving the second organic molecules 27 in the solvent is then spin-coated.

The solvent used for the solution of the second organic molecules 27 which is spin-coated is desirably the same one as is used in the above soaking method. As for a concentration of the solution, when it is excessively high, an unnecessary, multilayer and physically adsorbed deposit increases, and when it is excessively low, a sufficient adsorption amount of second organic molecules 27 cannot be obtained. For this reason, as in the above soaking method, the concentration is desirably set to about 1 to 100 mM.

After the application, the semiconductor substrate 10 may be heated on a hot plate, to evaporate the solvent used for the solution of the second organic molecule 27. The temperature of the hot plate is desirably a temperature at which the solvent used for the solution of the second organic molecules 27 tends to evaporate and the second organic molecules 27 resist reaction with impurities in the air. That is, it is desirably about 100 to 150° C. It is also desirable that the heating time has a length in which the solvent used for the solution of the second organic molecules 27 tends to evaporate and the second organic molecules 27 resist reaction with impurities in the air. That is, it is desirably about 30 to 120 seconds.

Using the above method, the organic molecular layer 14 is formed where the second organic molecular film 14b is adsorbed onto the first organic molecular film 14a.

Thereafter, for example, a hafnium oxide film is deposited on the organic molecular layer 14 by ALD (Atomic Layer Deposition), to form the block insulating film 16.

The block insulating film 16 can be formed by using ALD (Atomic Layer Deposition), spin-coating, sputtering, or the like. A formation method where the organic molecular layer 14 formed of the organic molecules is not disassembled and a damage is small is desirable. For example, thermal ALD or spin-coating is desirable. It is desirable that the insulating film after the film formation is annealed using a Rapid Thermal Annealing (RTA) device, since an atomic density in the film increases.

An impurity-doped polycrystalline silicon film is then formed by CVD (Chemical Vapor Deposition), for example, to form the control gate electrode 18. The stacked films are then patterned, thereby to form a gate electrode structure.

Subsequently, for example, p-type impurities are ion-planted using the control gate electrode 18 as a mask, to form the source region 20 and the drain region 22. In such a manner, it is possible to manufacture the nonvolatile semiconductor memory device shown in FIG. 1.

In the case of forming a film of the first organic molecules 26 which is provided with the charge storing unit 26b by self-assembling to form it as the first organic molecular film 14a being the self-assembled monolayer, the first organic molecular film 14a tends to be a hydrophobic surface. For example, when a metal oxide film is intended to be formed on the hydrophobic surface, initial film formation reaction is difficult to occur, and a film with inferior quality might be formed. That is, a film having inferior insulation properties and a low reliability might be formed.

According to the present embodiment, the second organic molecular film 14b formed of the second organic molecules 27 as the amphiphilic organic molecules are formed on the first organic molecular film 14a. This can render the surface of the organic molecular layer 14 being hydrophilic. Hence it is possible to improve a quality of the film formed on the organic molecular layer 14.

For example, in the case of forming a film of aluminum oxide as the metal oxide by ALD, the substrate is exposed alternately to water and trimethylaluminium while heated, to form the aluminum oxide film. However, when the substrate surface is hydrophobic, it tends to repel water and trimethylaluminium rejects reaction with the surface, whereby the aluminum oxide film tends to be a low-density film.

Nevertheless, when the second organic molecules 27 as the amphiphilic organic molecules are introduced thereinto to render the substrate surface being hydrophilic, water wettability is better and trimethylaluminium is likely to react with the surface. For this reason, a high-density aluminum oxide film is formed. When another metal oxide is to be formed, for a similar reason, a high-density film is obtained by introducing the second organic molecules 27.

According to the present embodiment, therefore, it is possible to realize the block insulating film 16 with high quality. This leads to an improvement in insulation properties between the charge storing unit 26b and the control gate electrode 18. It is thus possible to realize the nonvolatile semiconductor memory device excellent in data retention properties. Further, the reliability in block insulating film improves, to allow realization of the nonvolatile semiconductor memory device excellent in reliability.

Moreover, the block insulating film 16 can be made thinner while holding insulation properties. Hence it is possible to realize the nonvolatile semiconductor device provided with the fine memory cell.

Second Embodiment

A nonvolatile semiconductor memory device according to this embodiment differs from that of the first embodiment in that the tunnel insulating film is not provided and the first organic molecular film in the organic molecular layer has a function of the tunnel insulating film. Hereinafter, descriptions of contents that overlap with those of the first embodiment will be omitted.

Figure 10:
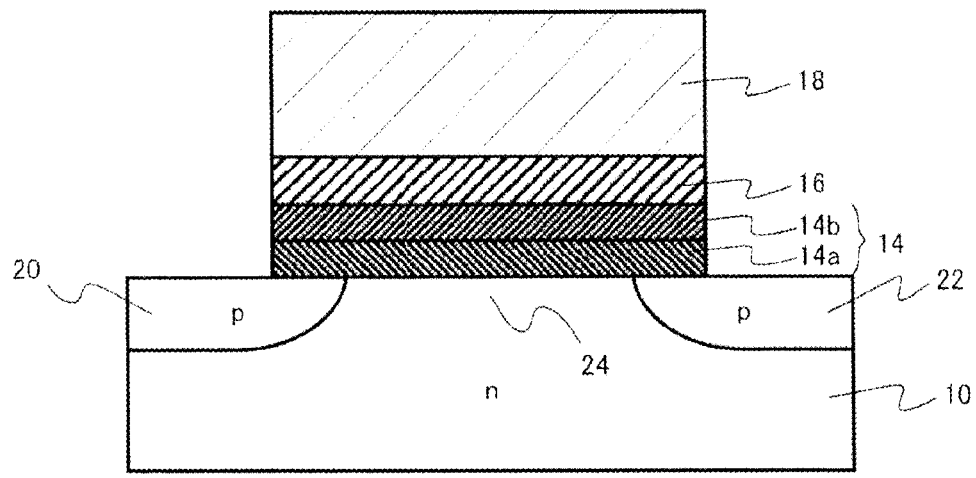
FIG. 10 is a sectional view of a memory cell unit of a nonvolatile semiconductor memory device according to a second embodiment.

FIG. 10 is a sectional view of a memory cell unit of the nonvolatile semiconductor memory device according to the present embodiment.

The memory cell is formed, for example, on an n-type silicon semiconductor layer 10 containing n-type impurities. The organic molecular layer 14 is provided on the semiconductor layer 10, the block insulating film 16 is provided on the organic molecular layer 14, and the control gate electrode 18 is provided on the block insulating film 16. On both sides of the control gate electrode 18, the source region 20 and the drain region 22 are formed in the semiconductor layer 10. A region below the gate electrode 18 in the semiconductor layer 10 is the channel region 24. The channel region 24 is interposed between the source region 20 and the drain region 22.

The first organic molecular film 14a in the organic molecular layer 14 also has the function of the tunnel insulating film.

In the present embodiment, the first organic molecules 26 contained in the first organic molecular film 14a are chemically bonded directly to the semiconductor layer 10. Then, the first organic molecular film 14a is a self-assembled monolayer.

As in the first embodiment, the first organic molecule 26 has a function to store charges that are to be data of the memory cell. As shown in FIG. 3, the first organic molecule 26 is made up of a terminal group (modified group) 26a that is chemically bonded to the tunnel insulating film 12, a charge storing unit 26b that stores charges, and a connecting unit 26c that connects the terminal group 26a and the charge storing unit 26b.

Then, the first organic molecule 26 is provided with an insulating unit between the charge storing unit 26b and the semiconductor layer 10. Herein, the connecting unit 26c corresponds to the insulating unit. The connecting unit 26c contains straight chain saturated hydrocarbon.

The connecting unit 26c is, for example, an alkyl molecular chain. The alkyl molecular chain is, for example, an alkyl chain, an isoalkyl chain or a halogen alkyl chain. The connecting unit 26c may be provided with a side chain. The function as the tunnel insulating film is exerted by this alkyl molecular chain.

For this reason, the carbon number of the alkyl molecular chain is preferably not smaller than 8 and not larger than 30, and is more desirably not smaller than 10 and not larger than 20. This is because, when the carbon number is below the above range, the insulating resistance might deteriorate and the self-assembled monolayer might be difficult to form. Further, when the carbon number exceeds the above range, the film thickness might be large, rendering the scaling-down being difficult. Especially, the carbon number of the alkyl molecular chain is further desirably 18 since the self-assembled monolayer can then be manufactured in a stable manner.

Moreover, since a dielectric constant of the alkyl molecular chain is about 2 to 3 which is higher than that of vacuum, the electric field applied to the insulating region is small as compared with that of vacuum. For this reason, the FN (Fowler-Nordheim) tunneling probability is also is low, as compared with that in vacuum. Hence, as a density of the alkyl molecular chain increases and a gap (vacuum unit) between the alkyl molecular chains becomes smaller, the insulation resistance improves. Also from this viewpoint, it is desirable to form the alkyl molecular chain as the self-assembled monolayer.

Further, the alkyl molecular chain also has an advantage of facilitating the formation of a high-density film since its intermolecular force, in particular, stably functions among self-assemblable molecules.

The method for manufacturing the nonvolatile semiconductor device according to the present embodiment includes: forming on the semiconductor layer 10 the first organic molecular film 14a that contains the first organic molecules 26 having the charge storing unit 26b as a monomolecular film by self-assembling; forming on the first organic molecular film 14a the second organic molecular film 14b that contains the second organic molecules 27 as amphiphilic organic molecules; forming the block insulating film 16 on the second organic molecular film 14b; and forming the control gate electrode 18 on the block insulating film 16.

For example, the organic molecular layer 14 is formed on the semiconductor layer (semiconductor substrate) 10 of monocrystalline silicon. The first organic molecular film 14a is formed by self-assembling, and the second organic molecular film 14b is subsequently formed on the first organic molecular film 14a.

The above is similar to that in the first embodiment except that the organic molecular layer 14 is formed directly on the semiconductor layer 10.

According to the above embodiment, in place of the tunnel insulating film of an inorganic material such as an oxide, the first organic molecular film 14a realizes the function of the tunnel insulating film, thereby to allow a reduction in physical thickness of the memory cell structure. Hence it is possible to realize the nonvolatile semiconductor device provided with the fine memory cell.

Further, eliminating the need for formation of the tunnel insulating film of the inorganic material can realize simplification of the manufacturing process.

Third Embodiment

A nonvolatile semiconductor memory device according to the present embodiment is similar to in the first embodiment except that a conductive layer is formed between the semiconductor layer and the organic molecular layer. Hereinafter, descriptions of contents that overlap with those of the first embodiment will be omitted.

Figure 11:
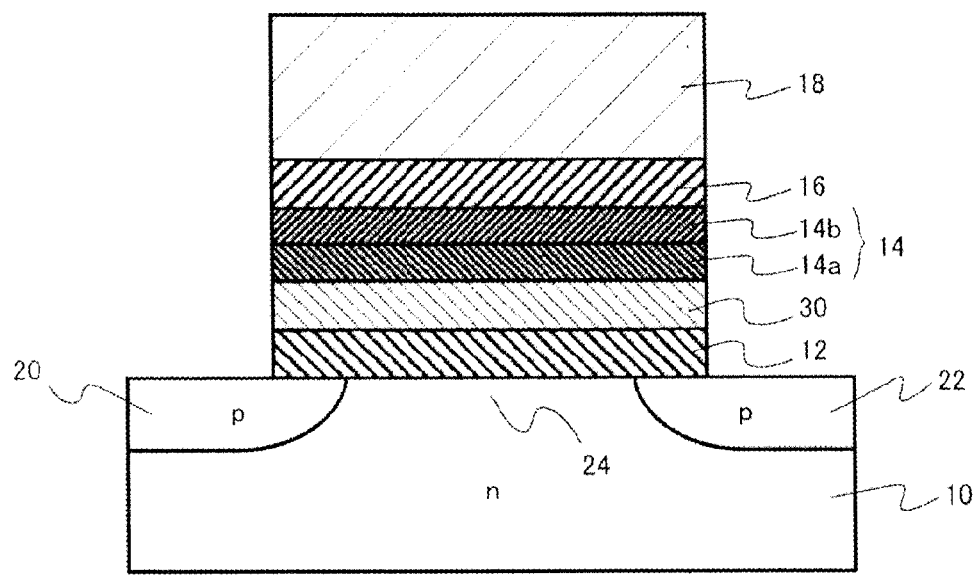
FIG. 11 is a sectional view of a memory cell unit of a nonvolatile semiconductor memory device according to a third embodiment.

FIG. 11 is a sectional view of a memory cell unit of the nonvolatile semiconductor memory device according to the present embodiment.

The memory cell is formed, for example, on an n-type silicon semiconductor layer 10 containing n-type impurities. The tunnel insulating film 12 is provided on the silicon semiconductor layer 10, a conductive layer 30 is provided on the tunnel insulating film 12, the organic molecular layer 14 is provided on the conductive layer 30, the block insulating film 16 is provided on the organic molecular layer 14, and the control gate electrode 18 is provided on the block insulating film 16. On both sides of the control gate electrode 18, the source region 20 and the drain region 22 are formed in the semiconductor layer 10. A region below the gate electrode 18 in the semiconductor layer 10 is a channel region 24. The channel region 24 is interposed between the source region 20 and the drain region 22.

The conductive layer 30 has a function to uniformly disperse charges stored in the organic molecular layer 14. Accordingly, a constant concentration distribution of charges without variations is realized inside the organic molecular layer 14, to realize a stable operation. Further, the conductive layer 30 has a function to read charges stored in the organic molecular layer 14 so as to improve writing efficiency.

The conductive layer 30 is, for example, a semiconductor film, a metal film, or a metal compound film. For example, it is possible to use polycrystalline silicon or amorphous silicon introduced with impurities to impart conductivity.

In the case of the present embodiment, the first organic molecule 26 is bonded onto the conductive layer 30 by self-assembling. In this case, when the conductive layer 30 is silicon, the terminal group 26a of the first organic molecule 26 is desirably a thiol group from the viewpoint of facilitating the bonding.

The method for manufacturing the nonvolatile semiconductor device according to the present embodiment includes: forming the tunnel insulating film 12 on the semiconductor layer 10; forming the conductive layer 30 on the tunnel insulating film 12; forming on the conductive layer 30 the first organic molecular film 14a that contains the first organic molecules 26 having the charge storing unit 26b as a monomolecular film by self-assembling; forming on the first organic molecular film 14a the second organic molecular film 14b that contains the second organic molecules 27 as amphiphilic organic molecules; forming the block insulating film 16 on the second organic molecular film 14b; and forming the control gate electrode 18 on the block insulating film 16.

The conductive layer 30 is formed on the tunnel insulating film 12 for example, by CVD, ALD or sputtering. The organic molecular layer 14 is then formed on the conductive layer 30.

The above is similar to that in the first embodiment except that the tunnel insulating film 12 is formed on the semiconductor layer 10 and the organic molecular layer 14 is formed on the conductive layer 30.

According to the present embodiment, it is possible to realize a nonvolatile semiconductor memory device whose operation is stable and is excellent in reading and writing characteristics.

Fourth Embodiment

A nonvolatile semiconductor memory device according to an embodiment includes: a semiconductor layer; a control gate electrode; and an organic molecular layer, which is formed between the semiconductor layer and the block insulating film, and provided with a first organic molecular film containing first organic molecules on the semiconductor layer side and a second organic molecular film containing second organic molecules on the block insulating film side, and in which the first organic molecule has a charge storing unit and the second organic molecule is an amphiphilic organic molecule. A nonvolatile semiconductor memory device according to this embodiment differs from that of the second embodiment in that the block insulating film is not provided and the second organic molecular film in the organic molecular layer has a function of the block insulating film. Hereinafter, descriptions of contents that overlap with those of the second embodiment will be omitted.

Figure 12:
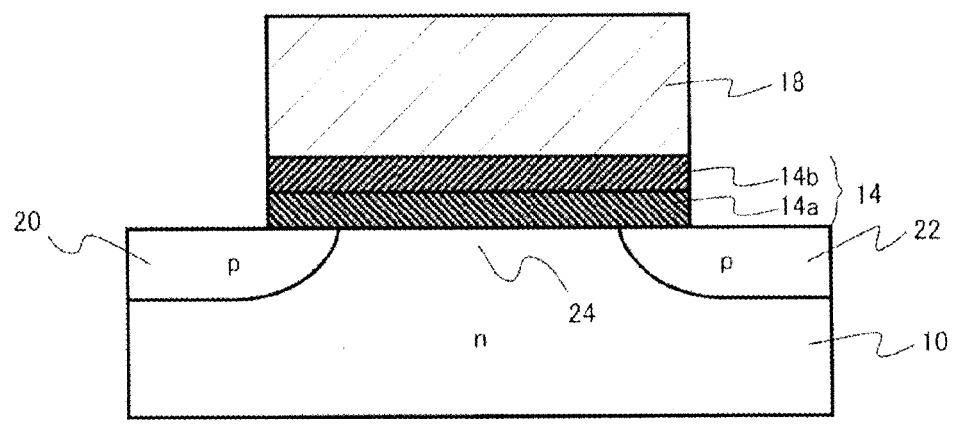
FIG. 12 is a sectional view of a memory cell unit of a nonvolatile semiconductor memory device according to a fourth embodiment.

FIG. 12 is a sectional view of a memory cell unit of the nonvolatile semiconductor memory device according to the present embodiment.

The memory cell is formed, for example, on an n-type silicon semiconductor layer 10 containing n-type impurities. The organic molecular layer 14 is provided on the semiconductor layer 10, and the control gate electrode 18 is provided on the organic molecular layer 14. On both sides of the control gate electrode 18, the source region 20 and the drain region 22 are formed in the semiconductor layer 10. A region below the gate electrode 18 in the semiconductor layer 10 is a channel region 24. The channel region 24 is interposed between the source region 20 and the drain region 22.

As in the second embodiment, the first organic molecular film 14a in the organic molecular layer 14 also has the function of the tunnel insulating film. Further, the second organic molecular film 14b in the organic molecular layer 14 also has the function of the block insulating film.

The second organic molecule 27 contained in the second organic molecular film 14b contains straight chain saturated hydrocarbon. Straight chain saturated hydrocarbon leads to an improvement in insulation properties.

It is to be noted that saturated hydrocarbon may contain oxygen in its structure. For example, even ethylene glycol is applicable when its molecular chain is long. Further, polysilane is known to have conductivity, and is thus not desirable.

The length of the molecular chain is desirably not smaller than 1 nm, and more desirably not smaller than 2 nm.

A main chain of the second organic molecule 27 is, for example, an alkyl molecular chain. The alkyl molecular chain is, for example, an alkyl chain, an isoalkyl chain or a halogen alkyl chain. The second organic molecule 27 may be a molecule provided with a side chain.

For this reason, the carbon number of the alkyl molecular chain is preferably not smaller than 8 and not larger than 30, and is more desirably not smaller than 10 and not larger than 20. This is because, when the carbon number falls below the above range, the insulation properties might deteriorate. Further, when the carbon number exceeds the above range, the film thickness might become large, to render the scaling-down being difficult.

As a material for the control gate electrode 18, there is used a conductive material which can obtain favorite film characteristic when forming a foundation for the hydrophilic surface to, e.g., metals such as nickel (Ni) and titanium (Ti).

The method for manufacturing the nonvolatile semiconductor device according to the present embodiment includes: forming on the semiconductor layer 10 the first organic molecular film 14a that contains the first organic molecules 26 having the charge storing unit 26b as a monomolecular film by self-assembling; forming on the first organic molecular film 14a the second organic molecular film 14b that contains the second organic molecules 27 as amphiphilic organic molecules; and forming the control gate electrode 18 on the second organic molecular film 14b.

For example, the organic molecular layer 14 is formed on the semiconductor layer (semiconductor substrate) 10 of monocrystalline silicon. The first organic molecular film 14a is formed by self-assembling, and the second organic molecular film 14b is subsequently formed on the first organic molecular film 14a.

Then, the control gate electrode 18 is formed on the second organic molecular film 14b, for example, by CVD, ALD or the like.

The above is similar to that in the first embodiment except that the organic molecular layer 14 is formed directly on the semiconductor layer 10, and the control gate electrode 18 is formed directly on the organic molecular layer 14.

According to the present embodiment, the organic molecular layer 14 is made to play both functions of the tunnel insulating film and the block insulating film. Therefore, the physical film thickness of the memory cell structure can be small. Hence it is possible to realize the nonvolatile semiconductor device provided with the fine memory cell.

Further, eliminating the need for the formation of the tunnel insulating film of the inorganic material and the block insulating film can realize simplification of the manufacturing process.

Fifth Embodiment

A nonvolatile semiconductor memory device according to the present embodiment is similar to that in the first embodiment except that a transistor of the memory cell is an n-type transistor whose carriers are electrons. Hence descriptions of contents that overlap with those of the first embodiment will be omitted.

Figure 13:
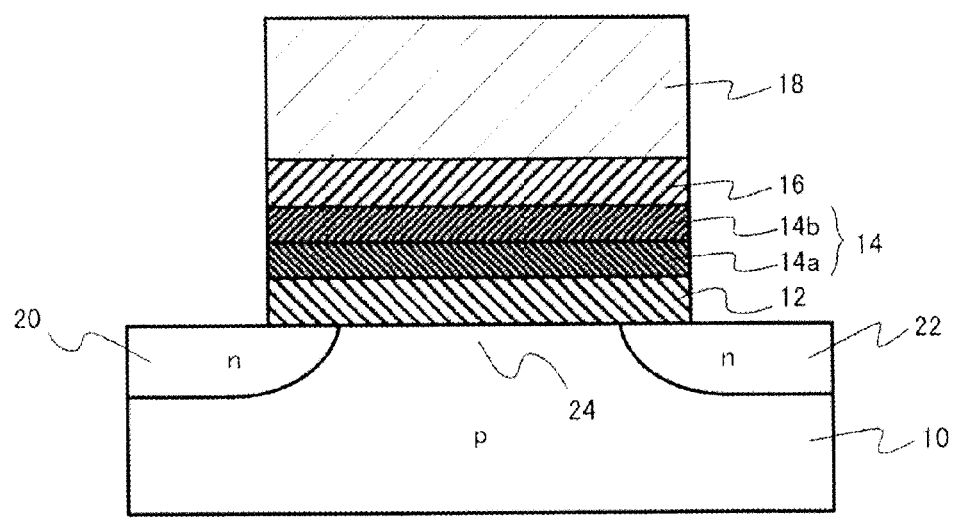
FIG. 13 is a sectional view of a memory cell unit of a nonvolatile semiconductor memory device according to a fifth embodiment.

FIG. 13 is a sectional view of a memory cell unit of the nonvolatile semiconductor memory device according to the present embodiment.

The memory cell is formed, for example, on a p-type silicon semiconductor layer 10 containing p-type impurities. The tunnel insulating film 12 is provided on the silicon semiconductor layer 10, the organic molecular layer 14 is provided on the tunnel insulating film 12, the block insulating film 16 is provided on the organic molecular layer 14, and the control gate electrode 18 is provided on the block insulating film 16. On both sides of the control gate electrode 18, the source region 20 and the drain region 22 are formed in the semiconductor layer 10. A region below the gate electrode 18 in the semiconductor layer 10 is a channel region. The channel region 24 is interposed between the source region 20 and the drain region 22.

Moreover, the source region 20 and the drain region 22 are formed, for example, of n-type diffusion layers containing n-type impurities.

A charge storing unit 26b of the first organic molecule 26 in the organic molecular layer 14 is applied with molecules that store electrons as charges. For example, fullerene shown in FIG. 7 can be used.

Similarly to the first embodiment, also in the present embodiment, using the amphiphilic organic molecules as the second organic molecules 27 in the organic molecular layer 14 allows realization of the nonvolatile semiconductor device provided with a fine memory cell excellent in data storing characteristics and reliability.

Sixth Embodiment

A nonvolatile semiconductor memory device according to the present embodiment includes: a stacked structure in which insulating layers and control gate electrode layers are alternately stacked; a block insulating film provided on the side surface of a hole that is provided penetrating the stacked structure from its top surface to the lowermost control gate electrode layer with respect to a stacking direction of the stacked structure; an organic molecular layer, which is provided with a first organic molecular film containing the first organic molecules and formed on the inner surface of the block insulating film, and a second organic molecular film containing second organic molecules and formed on the inner surface of the first organic molecular film, and in which the first organic molecule has a charge storing unit and the second organic molecule is an amphiphilic organic molecule; a tunnel insulating film provided on the inner surface of the organic molecular layer; and a semiconductor layer provided on the inner surface of the tunnel insulating film.

The nonvolatile semiconductor memory device according to the present embodiment differs from that of the first embodiment in that it is a three-dimensional device using the so-called BiCS (Bit-Cost Scalable) technique. As for the organic molecular layer, however, it is similar to in the first embodiment except that the first organic molecular film is provided on the block insulating film side and the second organic molecular film is provided on the tunnel insulating film side. Hence descriptions of contents that overlap with those of the first embodiment will be omitted.

Figure 14:
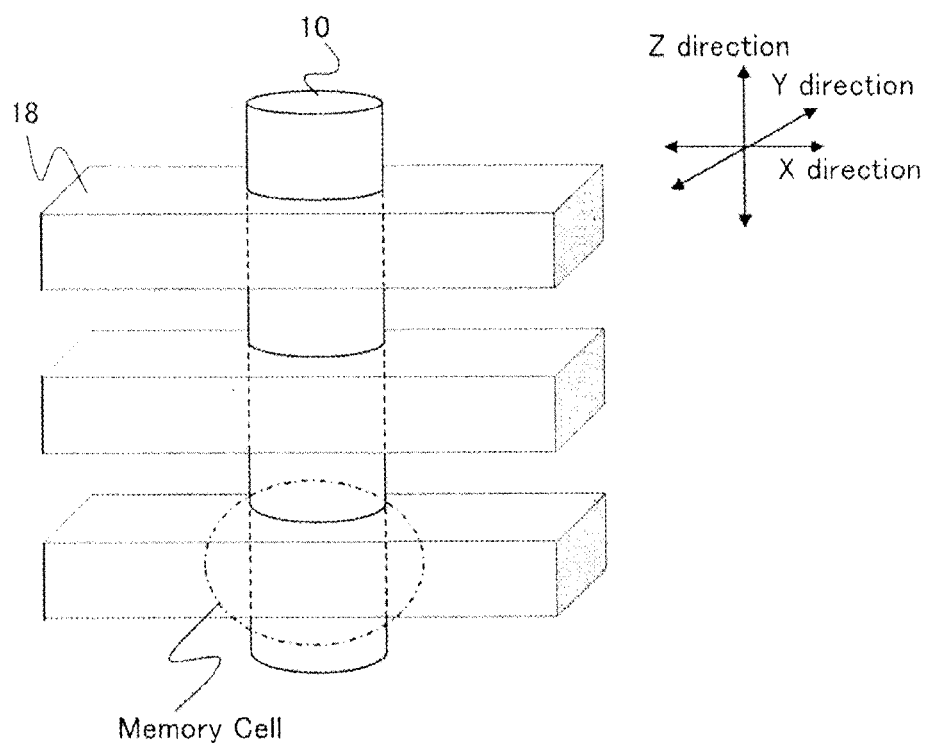
FIG. 14 is a three-dimensional conceptual diagram of each of the nonvolatile semiconductor memory devices according to sixth and seventh embodiments.
Figure 16:
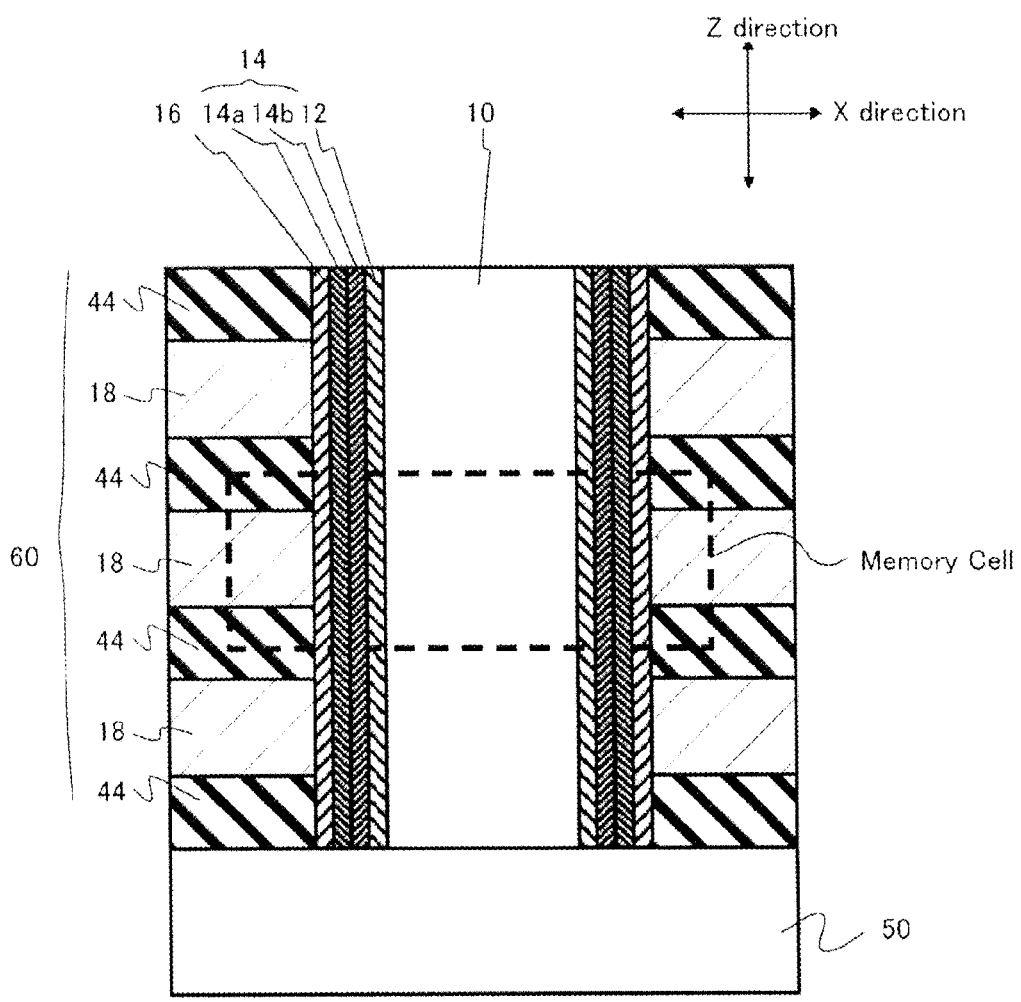
FIG. 16 is an X-Z sectional view of the nonvolatile semiconductor memory device of FIG. 14 according to the sixth embodiment.

FIG. 14 is a three-dimensional conceptual diagram of the nonvolatile semiconductor memory device according to the present embodiment. FIG. 15 is an X-Y sectional view of FIG. 14. FIG. 16 is an X-Z sectional view of FIG. 14.

The nonvolatile semiconductor memory device according to the present embodiment is provided, for example, with a stacked structure 60 where a plurality of insulating layers 44 and control gate electrodes 18 are alternately stacked on a silicon substrate 50. The insulating layer 44 is, for example, a silicon oxide film. Further, the gate electrode 18 is, for example, polycrystalline silicon doped with impurities to impart conductivity.

A hole is provided which penetrates the stacked structure 60 from its top to the lowermost control gate electrode 18. The block insulating film 16 is provided on the side surface of the hole, and the organic molecular layer 14 is provided on the inner surface of the block insulating film 16. The block insulating film 16 is, for example, aluminum oxide ($Al_2O_3$).

Further, the tunnel insulating film 12 is provided on the inner surface of the organic molecular layer 14. The tunnel insulating film 12 is, for example, a silicon oxide film.

Further, the columnar semiconductor layer 10 is formed on the inner surface of the tunnel insulating film 12. The semiconductor layer 10 is, for example, silicon.

In each of FIGS. 14 and 16, a region surrounded by a dashed line is the memory cell. The memory cell has a structure in which the tunnel insulating film 12 is formed on the semiconductor layer 10, the organic molecular layer 14 is formed on the tunnel insulating film 12, the block insulating film 16 is formed on the organic molecular layer 14, and the gate electrode 18 is formed on the block insulating film 16.

A method for manufacturing the nonvolatile semiconductor memory device according to the present embodiment includes: alternately depositing a plurality of insulating layers and control gate electrode layers on a substrate to form a stacked structure; forming a hole that penetrates the stacked structure from its top surface to the lowermost control gate electrode layer; forming a block insulating film on the side surface of the hole; forming as a monomolecular film a first organic molecular film which contains the first organic molecules having charge storing units, on the inner surface of the block insulating film by self-assembling; forming a second organic molecular film which contains second organic molecules as amphiphilic organic molecules on the inner surface of the first organic molecular film; forming a tunnel insulating film on the inner surface of the second organic molecular film; and forming a semiconductor layer on the inner surface of the tunnel insulating film.

The tunnel insulating film 12 can be formed by using ALD (Atomic Layer Deposition), spin-coating or sputtering. A formation method where the organic molecular layer 14 formed of the organic molecules is not disassembled, damage is small and coverage inside the hole is high is desirable, and for example, thermal ALD or spin-coating is desirable.

The tunnel insulating film 12 is formed on the second organic molecular film 14b having hydrophilic properties. Hence the high-quality tunnel insulating film 12 is formed.

When the insulating film after the film formation is annealed using a Rapid Thermal Annealing (RTA) device, anatomic density in the film increases, which is desirable.

In the nonvolatile semiconductor memory device according to the present embodiment, the high-quality tunnel insulating film 12 can be realized by provision of the above configuration. This leads to an improvement in insulation properties between the charge storing unit 26b and the semiconductor layer 10, thereby improving data retention properties (retention properties). This also leads to an improvement in reliability of the tunnel insulating film 12.

Further, according to the present embodiment, the memory cell is made three-dimensional, to increase the integration degree of the memory cell, thereby allowing realization of a nonvolatile semiconductor memory device with a higher integration degree than those of the first to fifth embodiments.

Seventh Embodiment

The nonvolatile semiconductor memory device according to the present embodiment differs in that the tunnel insulating film is not provided and the semiconductor is formed directly on the inner side of the organic molecular layer. In the present embodiment, the organic molecular layer also has the function of the tunnel insulating film. Hereinafter, descriptions of contents that overlap with those of the sixth embodiment will be omitted.

Figure 18:
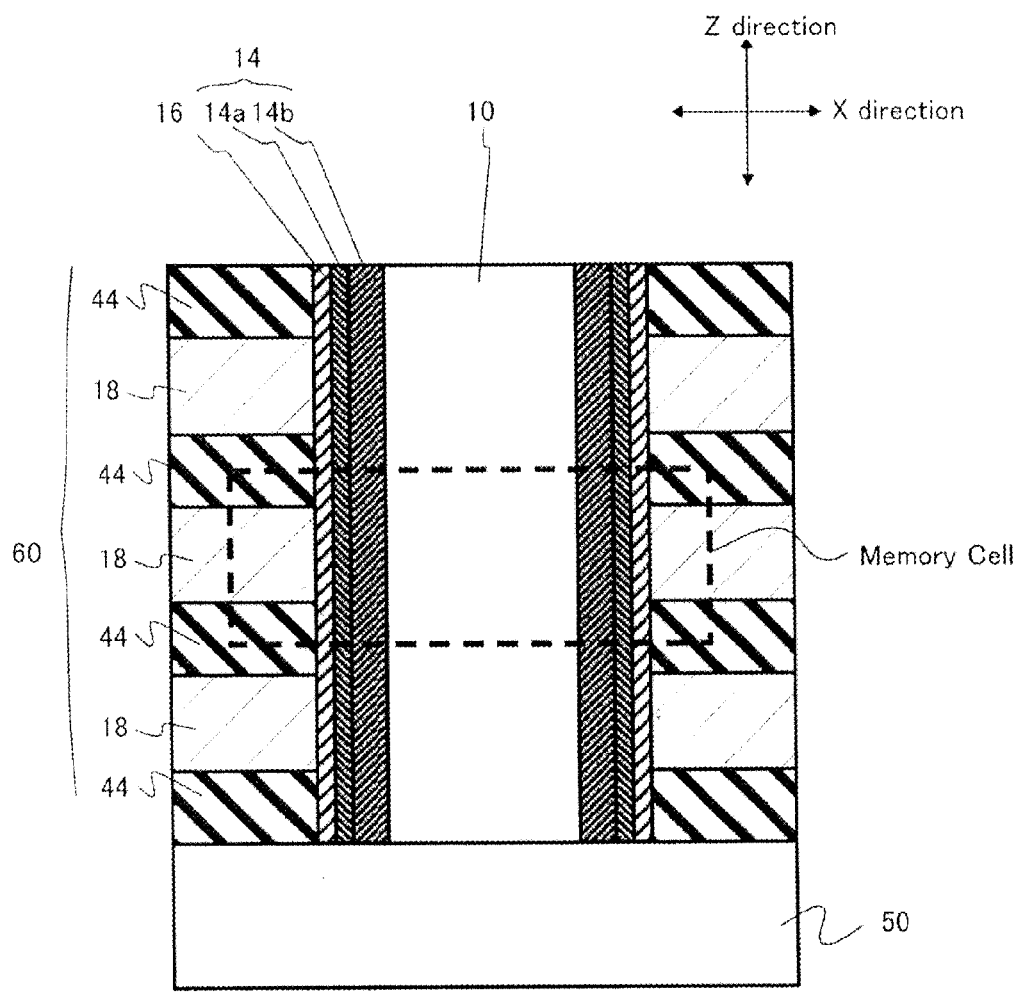
FIG. 18 is an X-Z sectional view of the nonvolatile semiconductor memory device of FIG. 14 according to the seventh embodiment.

FIG. 14 is a three-dimensional conceptual diagram of the nonvolatile semiconductor memory device according to the present embodiment. FIG. 17 is an X-Y sectional view of FIG. 14. FIG. 18 is an X-Z sectional view of FIG. 14.

The nonvolatile semiconductor memory device according to the present embodiment is provided, for example, with the stacked structure 60 where a plurality of insulating layers 44 and control gate electrodes 18 are alternately stacked on the silicon substrate 50. The insulating layer 44 is, for example, a silicon oxide film. Further, the gate electrode 18 is, for example, polycrystalline silicon doped with impurities and imparted with conductivity.

A hole is provided which penetrates the stacked structure 60 from its top to the lowermost control gate electrode 18. The block insulating film 16 is provided on the side surface of the hole. The block insulating film 16 is, for example, aluminum oxide ($Al_2O_3$).

The organic molecular layer 14 is provided on the inner surface of the block insulating film 16. The organic molecular layer 14 is provided with the first organic molecular film 14a on the block insulating film 16 side and the second organic molecular film 14b on the semiconductor layer 10 side.

Further, the second organic molecular film 14b in the organic molecular layer 14 also has the function of the tunnel insulating film.

The hydrophobic unit 27a of the second organic molecule 27 contained in the second organic molecular film 14b contains straight chain saturated hydrocarbon. Straight chain saturated hydrocarbon leads to improvement in insulation properties. The length of the straight chain is desirably not smaller than 1 nm, and more desirably not smaller than 2 nm.

A main chain of the hydrophobic unit 27a of the second organic molecule 27 is, for example, an alkyl molecular chain. The alkyl molecular chain is, for example, an alkyl chain, an isoalkyl chain or a halogen alkyl chain. The hydrophobic unit 27a of the second organic molecule 27 may be provided with a side chain.

For this reason, the carbon number of the alkyl molecular chain is preferably not smaller than 8 and not larger than 30, and is more desirably not smaller than 10 and not larger than 20. This is because, when the carbon number falls below the above range, the insulation properties might deteriorate. Further, when the carbon number exceeds the above range, the film thickness might become large, rendering the scaling-down being difficult.

Moreover, the columnar semiconductor layer 10 is formed on the inner surface of the organic molecular layer 14. The semiconductor layer 10 is, for example, silicon.

In each of FIGS. 14 and 18, a region surrounded by a dashed line is the memory cell. The memory cell has a structure in which the organic molecular layer 14 is formed on the semiconductor layer 10, the block insulating film 16 is formed on the organic molecular layer 14, and the gate electrode 18 is formed on the block insulating film 16.

A method for manufacturing the nonvolatile semiconductor memory device according to the present embodiment includes: alternately depositing a plurality of insulating layers and control gate electrode layers on a substrate to form a stacked structure; forming a hole that penetrates the stacked structure from its top surface to the lowermost control gate electrode layer; forming a block insulating film on the side surface of the hole; forming as a monomolecular film a first organic molecular film which contains the first organic molecules having charge storing units, on the inner surface of the block insulating film by self-assembling; forming a second organic molecular film which contains second organic molecules as amphiphilic organic molecules on the inner surface of the first organic molecular film; and forming a semiconductor layer on the inner surface of the second organic molecular film.

The semiconductor layer 10 can be formed, for example, using CVD. In CVD, the organic molecular layer 14 formed of the organic molecules might be disassembled. For this reason, for example, it is desirable to form a thin oxide film of $SiO_2$ or the like having a thickness of about 1 nm by ALD method, and thereafter form the semiconductor layer 10 on the inner surface of the oxide film by CVD.

In this case, the oxide film is formed on the second organic molecule as having hydrophilic properties, and the semiconductor layer 10 is formed on this oxide film. Therefore, a high quality oxide film is formed, thereby to suppress a damage on the organic molecular layer 14 caused by the formation of the semiconductor layer 10.

According to the above embodiment, in place of the tunnel insulating film of an inorganic material such as an oxide, the second organic molecular film 14b realizes the function of the tunnel insulating film. Therefore, the physical film thickness of the memory cell structure can be small. Hence it is possible to realize the nonvolatile semiconductor device provided with the fine memory cell.

Further, eliminating the need for formation of the tunnel insulating film of the inorganic material can realize simplification of the manufacturing process.

EXAMPLE

In the following, an example will be described.

Example

A film structure corresponding to the first embodiment was created and evaluated.

Using a p-type silicon substrate, two-terminal element is produced by the following method, and a pulse voltage is applied to write data, and capacitance characteristics before and after the application are measured. It is thereby possible to check a charge storage amount and charge retention time.

The p-type silicon substrate was introduced into a thermal oxidization furnace, to form a silicon oxide film on its surface. The thickness of the oxide silicon film was about 5 nm as a result of measuring the film thickness. Next, using an ALD device, an aluminum oxide was formed to a film on the oxide silicon substrate for only a cycle. A thickness of the aluminum oxide film was not larger than 1 nm.

Subsequently, the surface of the formed oxide silicon film was irradiated to clean by a UV cleaner for ten minutes.

Figure 19:
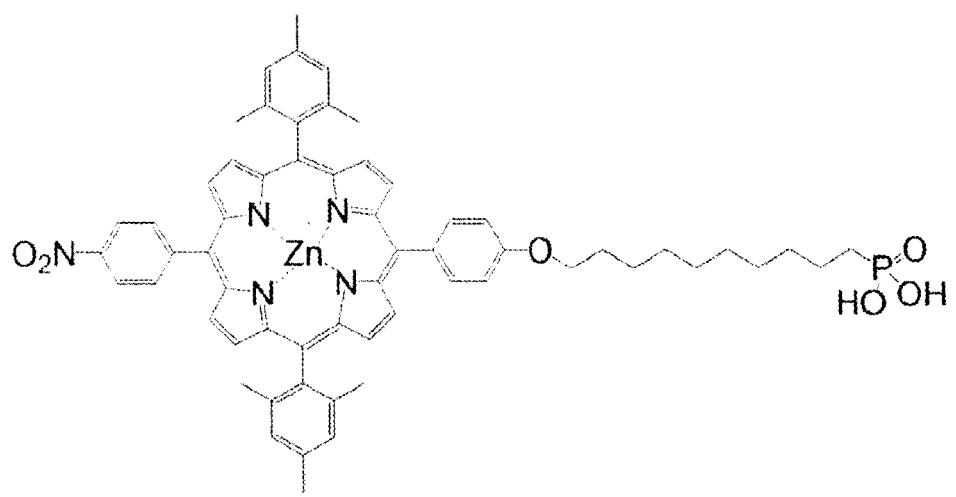
FIG. 19 is a diagram showing a molecular structure of a first organic molecule described in Example.

FIG. 19 is a diagram showing a molecular structure of a first organic molecule used in the present example. The cleaned substrate was put into a dehydrated toluene solution obtained by dissolving the first organic molecules with the structure shown in FIG. 19 in a concentration of 1 mM, and allowed to stand during a whole day and night.

Thereafter, the substrate was removed and transferred into pure toluene, and then rinsed while being stimulated by an ultrasonic cleaner for a minute. It is to be noted that this rinsing operation was performed twice in total as toluene was replaced by a new one.

Thereafter, the substrate rinsed by toluene was transferred into pure ethanol, rinsed while being stimulated by the ultrasonic cleaner for a minute, and then dried using an air duster.

Next, a solution obtained by dissolving pentaethyleneglycol monododecylether as the second organic molecules in a concentration of 1 mM in ethanol was spin-coated, and baked on a hot plate at 100° C. for 90 seconds. Subsequently, the substrate was introduced into a thermal ALD device, to form a hafnium oxide film on the second organic molecules at 150° C. The thickness of the hafnium oxide film was about 10 nm as a result of measuring the film thickness.

Then, the rear surface of the substrate was soaked in a hydrofluoric acid aqueous solution with a concentration of 0.5% to remove an unnecessary oxide film formed on the rear surface, and rinsed by pure water. Subsequently, aluminum was deposited on the rear surface, to give a substrate-side electrode.

Further, gold was deposited on the top surface of hafnium oxide of the substrate through a metal mask opened with a hollow, to give a control gate electrode. Finally, it was introduced into the RTA device, and annealed under a $N_2$ gas atmosphere mixed with 3% of $H_2$ at 300° C. for 30 minutes, to produce a two-terminal element.

Comparative Example

A two-terminal element was formed in a similar manner to that in the example except that the second organic molecules were not formed but hafnium oxide was formed on the first organic molecules.

The aluminum electrode on the rear surface of each of the elements according to the example and the comparative example was brought into contact with a stage of a measurement device to take a terminal, and a measuring needle was brought into contact with the gold electrode on the top surface to take a terminal, and capacitance measurement was performed while a voltage was changed. Next, a pulse voltage was applied to write data, and the capacitance measurement was performed again while the voltage was changed, to measure an amount of charges stored in gold nano particles.

Figure 20:
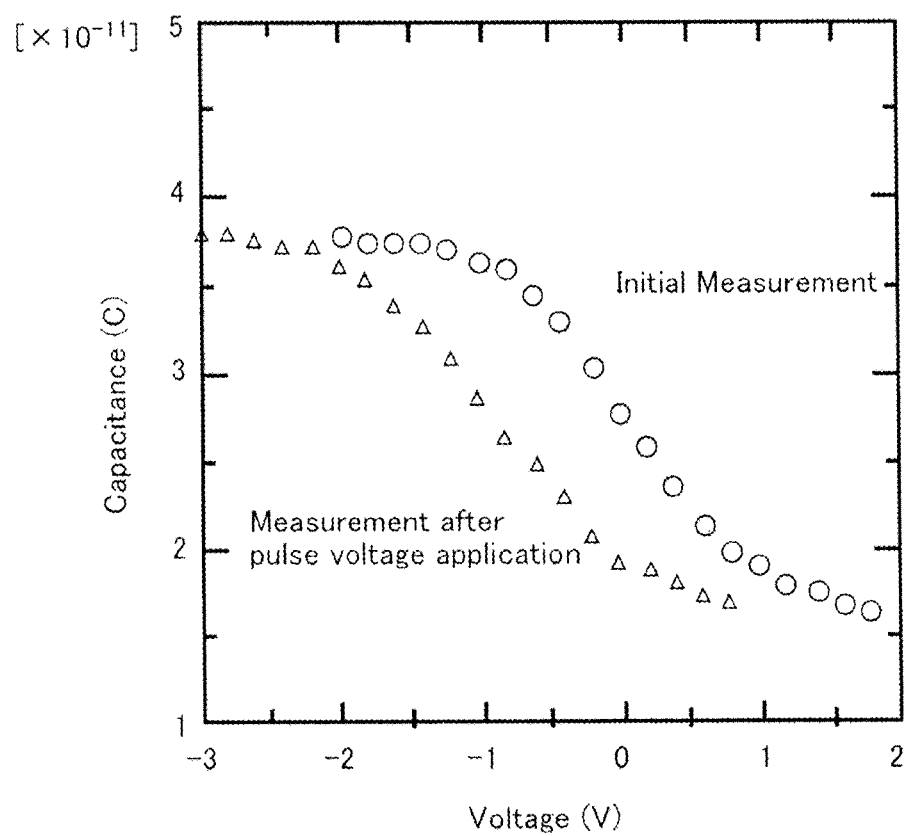
FIG. 20 is a diagram showing results of capacitance measurements described in Example.

FIG. 20 is a diagram showing results of the capacitance measurement before and after the pulse voltage application. It shows results of performing the capacitance measurement (initial measurement) on the element of the example and then performing the capacitance measurement again after applying a pulse voltage of –13V to the gold control gate electrode on the top surface for an application time of 100 ms. A capacitance saturated region was seen, and it was confirmed that a threshold voltage which is a voltage changing to the saturated region shifted in a minus direction.

This voltage shift indicates that positive charges transfer to the first organic molecules represented in FIG. 19 from the p-type silicon substrate due to the pulse voltage applied from the gold control gate electrode, and the positive charges are stored.

Figure 21:
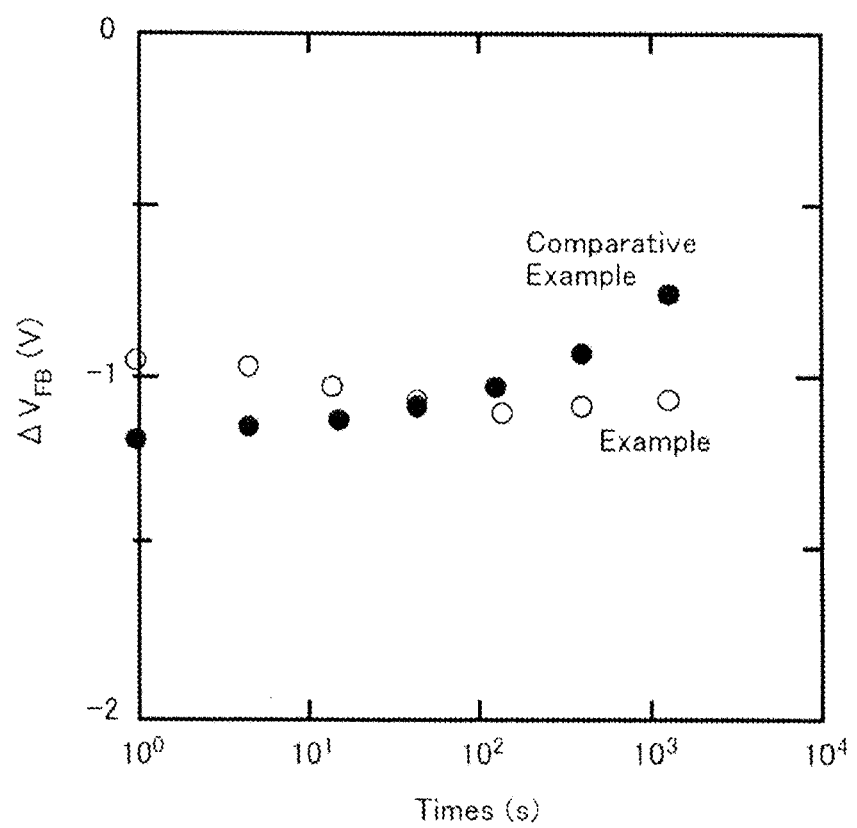
FIG. 21 is a diagram showing temporal changes of capacitances of Example and Comparative Example.

FIG. 21 is a diagram showing temporal changes of the capacitances. The capacitance measurement was performed at constant time intervals and values of the voltage changes were plotted with respect to the retention time.

The retention time for the stored charges can be evaluated by checking how much the value of the capacitance voltage shift has declined. The time in which the value of the voltage shift declined by 5% from the value measured immediately after the pulse application was determined. As shown in FIG. 21, it was found that the value did not decline by 5% within the measurement time in the case of the example.

When a similar measurement was performed in the comparative example, the time taken for the 5%-decline was about 3.20 s as shown in FIG. 21, and hence it was found that the retention time for the stored charges was longer in the case of the example than in the case of the comparative example. This is considered because introducing the second organic molecules as the amphiphilic organic molecules leads to an increase in density of the block insulating film as the hafnium oxide film formed by the ALD method, thereby providing improved insulation properties.

While certain embodiments have been described, these embodiments have been presented by way of example only, and are not intended to limit the scope of the inventions.

Indeed, non-volatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a semiconductor layer;
    a control gate electrode; and
    an organic molecular layer formed between the semiconductor layer and the control gate electrode, the organic molecular layer having a first organic molecular film on the semiconductor layer side containing first organic molecules, the organic molecular layer having second organic molecular film on the control gate electrode side containing second organic molecules, the first organic molecule having a charge storing unit, the second organic molecule being an amphiphilic organic molecule.

2. The device according to claim 1, wherein the amphiphilic organic molecule contains straight chain saturated hydrocarbon.

3. The device according to claim 1, wherein
    the amphiphilic organic molecule has a hydrophobic unit and a hydrophilic unit,
    the hydrophobic unit is an alkyl chain, a fluoroalkyl chain, a polysilane chain or a phenylene chain, and
    the hydrophilic unit has one of an ether group, a carboxy group, a hydroxy group, an amino group or a thiol group.

4. The device according to claim 1, wherein the amphiphilic organic molecule is polyethylene glycol alkylether shown in General Formula (I),

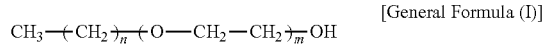

[General Formula (I)]

wherein, n is an integer not smaller than 3 and not larger than 20, and m is an integer not smaller than 3 and not larger than 20.

5. The device according to claim 1, wherein the amphiphilic organic molecule is trisiloxanepolyethylene glycol shown in General Formula (II),

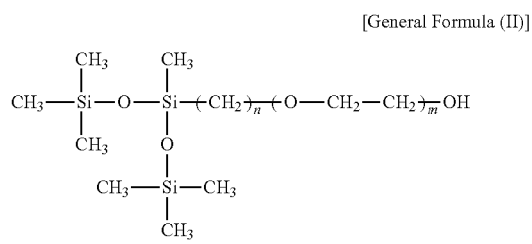

[General Formula (II)]

wherein, n is an integer not smaller than 3 and not larger than 20, and m is an integer not smaller than 3 and not larger than 20.

6. The device according to claim 1, wherein the amphiphilic organic molecule is pentaethyleneglycol monododecylether.

7. A nonvolatile semiconductor memory device, comprising:
    a stacked structure having insulating layers and control gate electrode layers, the insulating layers and the control gate electrode layers being alternately stacked;
    a block insulating film provided on a side surface of a hole penetrating the stacked structure from its top surface to the lowermost control gate electrode layer with respect to a stacking direction of the stacked structure;
    an organic molecular layer having a first organic molecular film formed on an inner surface of the block insulating film containing first organic molecules, the organic molecular layer having a second organic molecular film formed on an inner surface of the first organic molecular film containing second organic molecules, the first organic molecule having a charge storing unit, the second organic molecule being an amphiphilic organic molecule;
    a tunnel insulating film provided on the inner surface of the organic molecular layer; and
    a semiconductor layer provided on the inner surface of the tunnel insulating film.

8. The device according to claim 7, wherein
    the amphiphilic organic molecule has a hydrophobic unit and a hydrophilic unit,
    the hydrophobic unit is an alkyl chain, a fluoroalkyl chain, a polysilane chain or a phenylene chain, and
    the hydrophilic unit has one of an ether group, a carboxy group, a hydroxy group, an amino group or a thiol group.

9. The device according to claim 7, wherein the amphiphilic organic molecule is polyethylene glycol alkylether shown in General Formula (I),

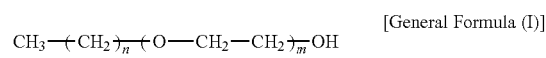

[General Formula (I)]

wherein, n is an integer not smaller than 3 and not larger than 20, and m is an integer not smaller than 3 and not larger than 20.

10. The device according to claim 7, wherein the amphiphilic organic molecule is trisiloxanepolyethylene glycol shown in General Formula (II),

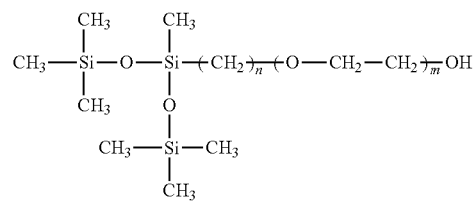

[General Formula (II)]

wherein, n is an integer not smaller than 3 and not larger than 20, and m is an integer not smaller than 3 and not larger than 20.

11. The device according to claim 7, wherein the amphiphilic organic molecule is pentaethyleneglycol monododecylether.

* * * * *